(12) United States Patent
Lee et al.

(10) Patent No.: US 7,688,568 B1
(45) Date of Patent: Mar. 30, 2010

(54) MULTILAYER CHIP CAPACITOR

(75) Inventors: Byoung Hwa Lee, Gyunggi-do (KR); Sung Kwon Wi, Seoul (KR); Hong Yeon Cho, Gyunggi-do (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/407,298

(22) Filed: Mar. 19, 2009

(30) Foreign Application Priority Data

Oct. 10, 2008 (KR) ...................... 10-2008-0099742

(51) Int. Cl.
  *H01G 4/228* (2006.01)

(52) U.S. Cl. .............. 361/306.3; 361/306.1; 361/321.1; 361/321.2; 361/303; 361/307

(58) Field of Classification Search ............... 361/306.3, 361/306.1, 306.2, 311–313, 321.1, 321.2, 361/301.4, 307, 308.1
See application file for complete search history.

(56) References Cited

U.S. PATENT DOCUMENTS

| | | | |
|---|---|---|---|
| 6,407,906 B1 * | 6/2002 | Ahiko et al. ............. | 361/306.1 |
| 6,762,925 B2 * | 7/2004 | Uchida et al. ............ | 361/321.1 |
| 7,035,079 B1 * | 4/2006 | Park et al. ................... | 361/303 |
| 7,224,572 B2 * | 5/2007 | Togashi et al. ........... | 361/306.3 |
| 7,292,430 B2 * | 11/2007 | Lee et al. ................. | 361/306.3 |
| 7,433,172 B2 * | 10/2008 | Togashi ................... | 361/306.1 |

FOREIGN PATENT DOCUMENTS

| JP | 06-053075 | 2/1994 |
|---|---|---|
| JP | 2006-286731 | 10/2006 |

* cited by examiner

*Primary Examiner*—Nguyen T Ha
(74) *Attorney, Agent, or Firm*—McDermott Will & Emery LLP

(57) ABSTRACT

A multilayer chip capacitor includes: a capacitor body having a plurality of dielectric layers laminated therein and comprising first and second capacitor units; and first to fourth external electrodes formed on an outer surface of the capacitor body, wherein the first capacitor unit comprises first and second internal electrodes facing each other with the dielectric layer interposed therebetween, connected to the first and second external electrodes, and having different polarities, each pair of first and second internal electrodes being laminated one or more times to discriminate a plurality of capacitors with a certain capacitance, the second capacitor unit comprises third and fourth internal electrodes facing each other with the dielectric layer interposed therebetween, connected to the third and fourth external electrodes, and having the same polarities as those of the first and second internal electrodes, each pair of third and fourth internal electrodes being laminated one or more times to discriminate one or more capacitors each with a certain capacitance, and at least three capacitors included in the first and second capacitor units have different capacitances or resonance frequencies.

39 Claims, 27 Drawing Sheets

MULTILAYER CHIP CAPACITOR

CROSS-REFERENCE TO RELATED APPLICATIONS

This application claims the priority of Korean Patent Application No. 2008-0099742 filed on Oct. 10, 2008, in the Korean Intellectual Property Office, the disclosure of which is incorporated herein by reference.

BACKGROUND OF THE INVENTION

1. Field of the Invention

The present invention relates to a multilayer chip capacitor and, more particularly, to a multilayer chip capacitor that can be suitably used as a decoupling capacitor of a power distribution network of a micro-processor unit (MPU) and reduce, as a single capacitor, impedance of the power distribution network to a target impedance or less in a broad frequency range of hundreds of kHz to hundreds of MHz.

2. Description of the Related Art

Designing a power distribution network (PDN) of a microprocessor unit (MPU) is increasingly difficult as the MPU becomes faster in speed and more integrated. In particular, a decrease in a power voltage and an increase in current consumption of the MPU resulting from the integration of the MPU lead to a gradual lowering of a target impedance ($Z_{target}$) as represented by equation shown below:

$$Z_{target} = Vp \times AR/I = Vr/I$$

In the equation, Vp is a power voltage, AR is an allowed ripple, 'I' is a current consumption of the MPU, and Vr is an allowed ripple voltage. Generally, the allowed ripple voltage Vr is about 5% to 10% of the power voltage. The target impedance ($Z_{target}$) should be satisfied not only in a direct current (DC) but also in all frequencies where transient current is present. In case of a personal computer (PC) or a notebook computer, as its CPU (MPU chip) operates at a high speed, a transient current exists even at a very high frequency range, and thus, a target impedance should be satisfied even in a broad frequency range. In order to satisfy the target impedance in each frequency range, the PDN employs a voltage regulator module (VRM), a bulk capacitor, a general two-terminal multilayer chip capacitor (MLCC), and a low equivalent series inductance (ESL) MLCC, and such PDN is called a multi-stage PDN.

The VRM, the bulk capacitor, and the general two-terminal MLCC serve to supply current in a frequency range of a few kHz, a few kHz to hundreds of kHz, and hundreds of kHz to a few Mhz, respectively, and lower impedance of the PDN. Unlike a bulk capacitor or the general two-terminal MLCC directly mounted on a motherboard, the low ESL MLCC is generally mounted on a CPU package, supplies current in a frequency range of a few MHz or higher, and serves to lower the impedance of the PDN. Finally, at a frequency higher than the valid frequency range of the low ESL MLCC, a die capacitor within a CPU supplies current and lowers the impedance of the PDN. The plurality of above-mentioned bulk capacitors, the general two-terminal MLCC, and the low ESL MLCC are connected in parallel to each other by using an R-L-C model.

FIG. 1 is a graph of the magnitude of impedance (Z) versus frequency of a general multi-stage PDN. In each stage, the impedance $Z_{REG}$, $Z_{BLK}$, $Z_{MF}$, $Z_{PKG}$, and $Z_{DIE}$ Of the VRM, bulk capacitor, general 2-terminal MLCC, low ESL MLCC and die capacitor determines the overall impedance of the PDN, and accordingly, it is noted that the impedance of each capacitor considerably affects an impedance profile of the entire PDN. In addition, an impedance of a previous stage capacitor is associated with that of a next stage capacitor to determine the overall impedance of the PDN. In designing the PDN, the impedance of each stage cannot be independently determined but should be determined in consideration of the overall impedance of the PDN. In general, the two-terminal MLCC having a relatively high ESL is mounted on the motherboard or the CPU package and used for mid-frequency decoupling, and the low ESL MLCC is mounted on the CPU package and used for high-frequency decoupling.

FIG. 2 is a cross-sectional view schematically showing a related art motherboard device with decoupling capacitors and MPU wiring connection structure (i.e., line connection structure). With reference to FIG. 2, a CPU (i.e., MPU chip) 51 is mounted on a package board 53 to form a CPU package 51 and 53, and the CPU package 51 plus 53 is surface-mounted on a motherboard 55. Wiring conductors, e.g., power (PWR) planes, ground (GND) planes, vias, and the like, are formed within and on the surface of the motherboard 55 and the package board 53 to configure a power circuit. Bumps or balls 15 are used to electrically connect the components 53 and 55. Different types of decoupling capacitors 10 and 20 are connected to such power circuit by frequency ranges to form the multi-stage PDN. The low ESL MSCC 10 for high-frequency decoupling, e.g., a low inductance ceramic capacitor (LICC) or an interdigital capacitor (IDC), may be mounted on a lower surface of the board 53 of the CPU package. The general MLCC 20 for mid-frequency decoupling may be directly mounted on an upper or lower surface of the motherboard 55 in the vicinity of the CPU package 51 plus 53, or may be mounted on the lower surface of the CPU package board 53.

As described above, in order to form the multi-stage PDN, the capacitors 10 and 20 of different structures are used according to each frequency range. Thus, different capacitor mounting surfaces or mounting portions should be provided by frequency ranges, and a large number of chip capacitors 10 and 20 are needed to lower the overall PDN impedance to below a target impedance.

SUMMARY OF THE INVENTION

An aspect of the present invention provides a multilayer chip capacitor capable of lowering a PDN impedance to below a target impedance at broad frequency range of hundreds of kHz to hundreds of MHz as a single capacitor.

According to an aspect of the present invention, there is provided a multilayer chip capacitor including: a capacitor body having a plurality of dielectric layers laminated therein and comprising first and second capacitor units; and first to fourth external electrodes formed on an outer surface of the capacitor body, wherein the first capacitor unit includes first and second internal electrodes facing each other with the dielectric layer interposed therebetween, connected to the first and second external electrodes, and having different polarities, each pair of first and second internal electrodes being laminated one or more times to discriminate a plurality of capacitors with a certain capacitance, the second capacitor unit includes third and fourth internal electrodes facing each other with the dielectric layer interposed therebetween, connected to the third and fourth external electrodes, and having the same polarities as those of the first and second internal electrodes, each pair of third and fourth internal electrodes being laminated one or more times to discriminate one or more capacitors each with a certain capacitance, and at least three capacitors included in the first and second capacitor units have different capacitances or resonance frequencies.

The first and second internal electrodes may include leads so as to be thereby connected to the first and second external electrodes, and internal electrodes of at least two of the plurality of capacitors constituting the first capacitor unit may have leads of different widths. In this case, a capacitor having an internal electrode with the widest lead, among the plurality of capacitors constituting the first capacitor unit, may be disposed at the lowermost portion of the first capacitor unit. Among the plurality of capacitors constituting the first capacitor unit, the lead of internal electrode included in a capacitor disposed at a lower portion may be wider than that of an internal electrode included in a capacitor disposed at an upper portion.

The first and second internal electrodes may include leads so as to be thereby connected to the first and second external electrodes, respectively, and internal electrodes included at least two of the plurality of capacitors constituting the first capacitor unit may have different number of leads.

An alternate disposition unit may be formed at one region of the first capacitor unit and have a structure in which the plurality of capacitors included in the first capacitor unit are alternately disposed, and a capacitance adjusting unit may be formed at another region of the first capacitor unit and have a structure in which at least one of the plurality of capacitors included in the first capacitor unit is repeatedly disposed. In this case, the second capacitor unit may be discriminated into a plurality of capacitors each having a pair of third internal electrodes and a pair of fourth internal electrodes laminated one or more times to have a certain capacitance, a second alternate disposition unit may be formed at one region of the second capacitor unit and have a structure in which the plurality of capacitors included in the first capacitor unit are alternately disposed, and a second capacitance adjusting unit may be formed at another region of the second capacitor unit and have a structure in which at least one of the plurality of capacitors included in the first capacitor unit is repeatedly disposed.

The alternate disposition unit may be disposed at a lower side of the capacitance adjusting unit in the first capacitor unit. The alternate disposition units may be disposed at the lowermost and uppermost portions within the capacitor body, and the second capacitor unit may be positioned between the alternate disposition units.

A plurality of alternate disposition units may be formed at one region of the first capacitor unit and have a structure in which two of the plurality of capacitors included in the first capacitor unit are alternately disposed, and a plurality of capacitance adjusting units may be formed at another region of the first capacitor unit and have a structure in which one of two capacitors included in each of the plurality of alternate disposition units is repeatedly laminated.

In this case, the plurality of capacitance adjusting units may be disposed at an upper portion of the plurality of alternate disposition units within the first capacitor unit.

The first and second internal electrodes may have leads so as to be thereby connected to the first and second external electrodes, and among the plurality of capacitors constituting the first capacitor unit, the internal electrode of a capacitor disposed at a lower portion than that disposed at an upper portion in the first capacitor unit has a wider lead.

The second capacitor unit may be discriminated into a plurality of capacitors each having a pair of third internal electrodes and a pair of fourth internal electrodes laminated one or more times to have a certain capacitance, the third and fourth internal electrodes may have leads so as to be thereby connected to the third and fourth external electrodes, and internal electrodes of at least two of the plurality of capacitors constituting the second capacitor unit may have leads of different widths.

In this case, among the plurality of capacitors constituting the second capacitor unit, a capacitor having an internal electrode with a widest lead may be disposed at the lowermost portion of the second capacitor unit.

Among the plurality of capacitors constituting the second capacitor unit, the lead of the internal electrodes included in a capacitor disposed at a lower portion may have a larger width than that of the internal electrode included in a capacitor disposed at an upper portion.

The second capacitor unit may be discriminated into a plurality of capacitors each having a pair of third internal electrodes and a pair of fourth internal electrodes laminated one or more times to have a certain capacitance, the third and fourth internal electrodes may have leads so as to be thereby connected to the third and fourth external electrodes, and internal electrodes of at least two of the plurality of capacitors constituting the second capacitor unit may have different numbers of leads.

An alternate disposition unit may be formed at one region of the capacitor body and have a structure in which the capacitors included in the first capacitor unit and those included in the second capacitor unit are alternately laminated, and a capacitance adjusting unit may be formed at another region of the capacitor body and have a structure in which at least one of the plurality of capacitors included in the first and second capacitor units is repeatedly disposed.

In this case, among the capacitors included in the first and second capacitor units, the capacitor included in the first capacitor unit may be disposed at the lowermost portion of the capacitor body.

The first to fourth internal electrodes may have leads so as to be thereby connected to the first to fourth external electrodes, and the lead of the internal electrode included in the capacitor disposed at the lowermost portion of the capacitor body may have the largest width.

A plurality of alternate disposition units may be formed at one region of the capacitor body and have a structure in which one of the plurality of capacitors included in the first capacitor unit and one of the plurality of capacitors included in the second capacitor unit are alternately disposed, and a plurality of capacitance adjusting units may be formed at another region of the capacitor body and have a structure in which one of two capacitors included in each of the plurality of alternate disposition units is repeatedly laminated.

An ESL per layer provided by one pair of first and second internal electrodes within the capacitors included in the first capacitor unit may be smaller than an ESL per layer provided by one pair of third and fourth internal electrodes within the capacitors included in the second capacitor unit.

In this case, the first capacitor unit may be disposed at a lower side of the second capacitor unit within the capacitor body.

The first and second capacitor units may be electrically separated.

The multilayer chip capacitors may be a four-terminal capacitor including the first to fourth external electrodes by ones. In this case, the first to fourth internal electrodes may be connected to the first to fourth external electrodes via a single lead, respectively.

The first and second external electrodes may be formed on first and second longer side faces facing each other of the capacitor body, and the third and fourth external electrodes may be formed on first and second shorter side faces facing each other of the capacitor body.

The first and second external electrodes may be formed on the mutually adjacent first longer side face and first shorter side face, the third external electrode may be formed on the second longer side face facing the first longer side face, and the fourth electrode may be formed on the second shorter side face facing the first shorter side face of the capacitor body.

The third and fourth external electrodes may be provided by twos, respectively, (namely, two third external electrodes and two fourth external electrodes are provided), the first and second external electrodes may be formed on the first and second longer side faces facing each other of the capacitor body, and the third and fourth external electrodes may be formed on the first and second longer side faces.

In this case, the first external electrode may be formed between the two third external electrodes, and the second external electrode may be formed between the two fourth external electrodes.

The first and second external electrodes may be provided by twos.

The third and fourth external electrodes may be provided by twos, the first and second external electrodes may be formed on the first and second longer side faces facing each other of the capacitor body, and the third and fourth external electrodes may be formed on the second and first longer side faces of the capacitor body.

In this case, the first external electrode may be formed between the two fourth external electrodes, and the second external electrode may be formed between the two third external electrodes.

The first and second external electrodes may be provided by twos, of which one is formed on the first longer side face, and the other is formed on the second longer side face facing the first longer side face, and the third and fourth external electrodes may be provided by twos, of which one is formed on the first longer side face and the other is formed on the second longer side face facing the first longer side face of the capacitor body.

In this case, the first and second external electrodes may be formed between the third and fourth external electrodes on the first and second longer side faces.

The polarities of the adjacent external electrodes on the first and second longer side faces may be different.

The first and second external electrodes may be provided by fours and may be formed by twos on the first and second longer side faces facing each other, and the third and fourth external electrodes may be formed on the first and second shorter side faces facing each other of the capacitor body.

In this case, the first and second external electrodes may be alternately formed on the first and second longer side faces.

The first and second internal electrodes may have four leads, respectively, so as to be thereby connected to the first and second external electrodes, and the leads of the first internal electrode and those of the second internal electrode may be adjacently arranged in an interdigitated form so as to be connected with the external electrodes of corresponding polarities.

The first and second internal electrodes may include a total of two leads led out to the first and second longer side faces so as to be connected to the first and second external electrodes, respectively, and in each of the first and second internal electrodes, the lead led out to the first longer side face may be shifted by one space corresponding to the position of a next external electrode with respect to the lead led out to the second longer side face, and in the first capacitor, the leads led out to the first and second longer side faces may be disposed in a zigzag manner along a laminated direction when viewed from each longer side face.

According to the present invention, the PDN impedance can be lowered to below a target impedance in the broad frequency range of hundreds of kHz to hundreds of MHz by using the single multilayer chip capacitor. Thus, the number of decoupling capacitors used for a high speed MPU can be drastically reduced and the mounting costs and mounting space or area of the decoupling capacitor can be effectively reduced. In addition, the problem of degradation of the capacitance caused as the single chip includes capacitor units each having a different capacitance can be solved.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
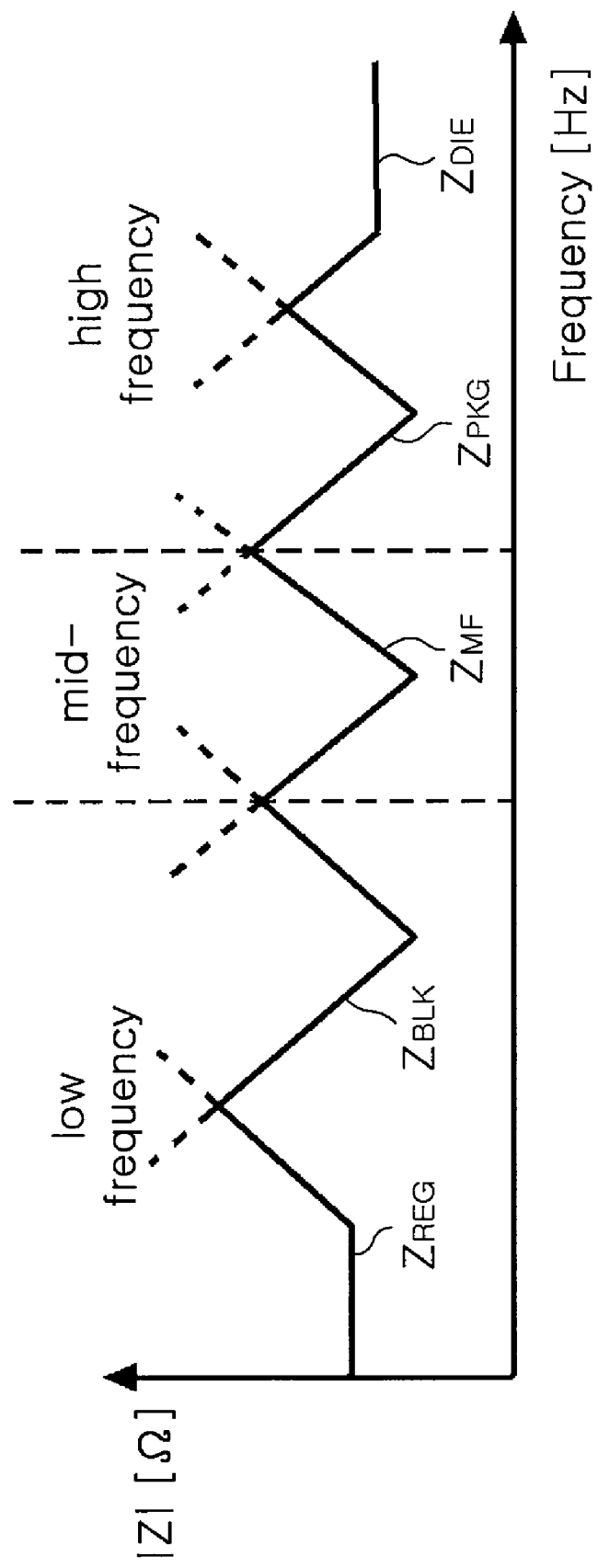
FIG. 1 is a graph of the magnitude of impedance (Z) versus frequency of a general multi-stage power distribution network (PDN)
Figure 2:
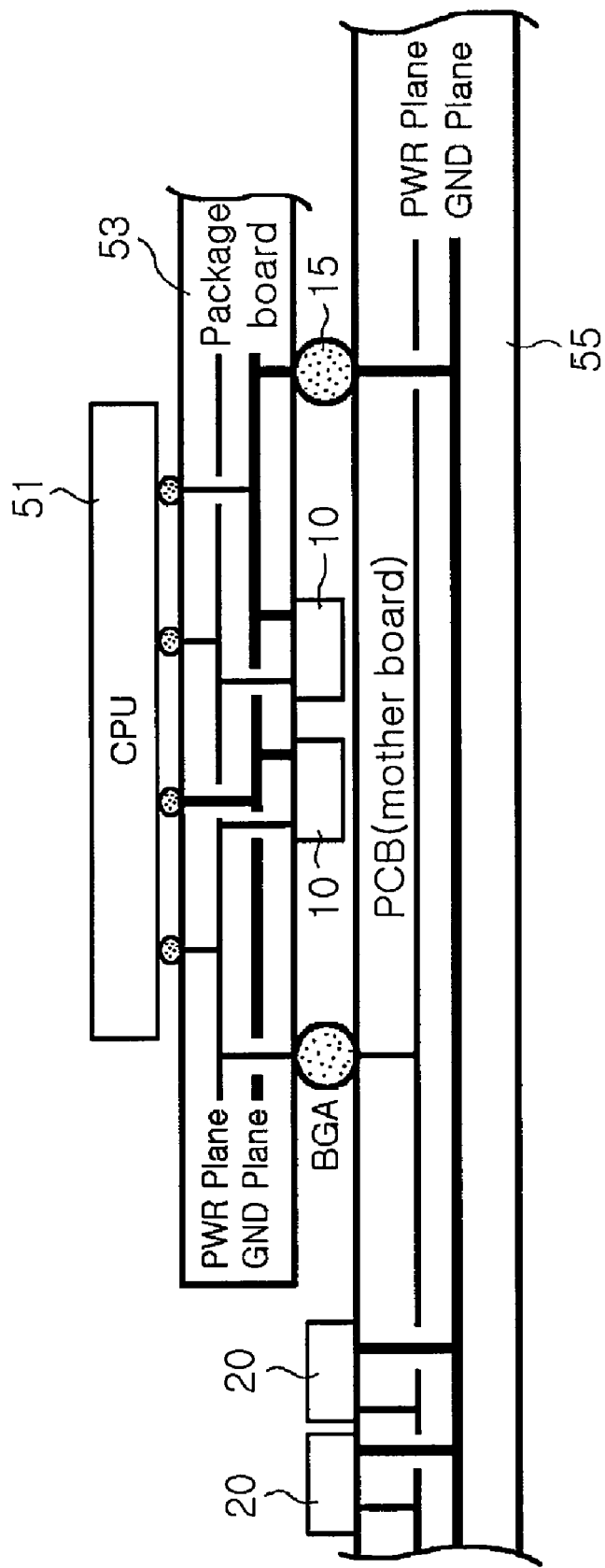
FIG. 2 is a cross-sectional view schematically illustrating a motherboard device (i.e., printed circuit board (PCB)) having decoupling capacitors and MPU wiring connection structure according to the related art.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 3:
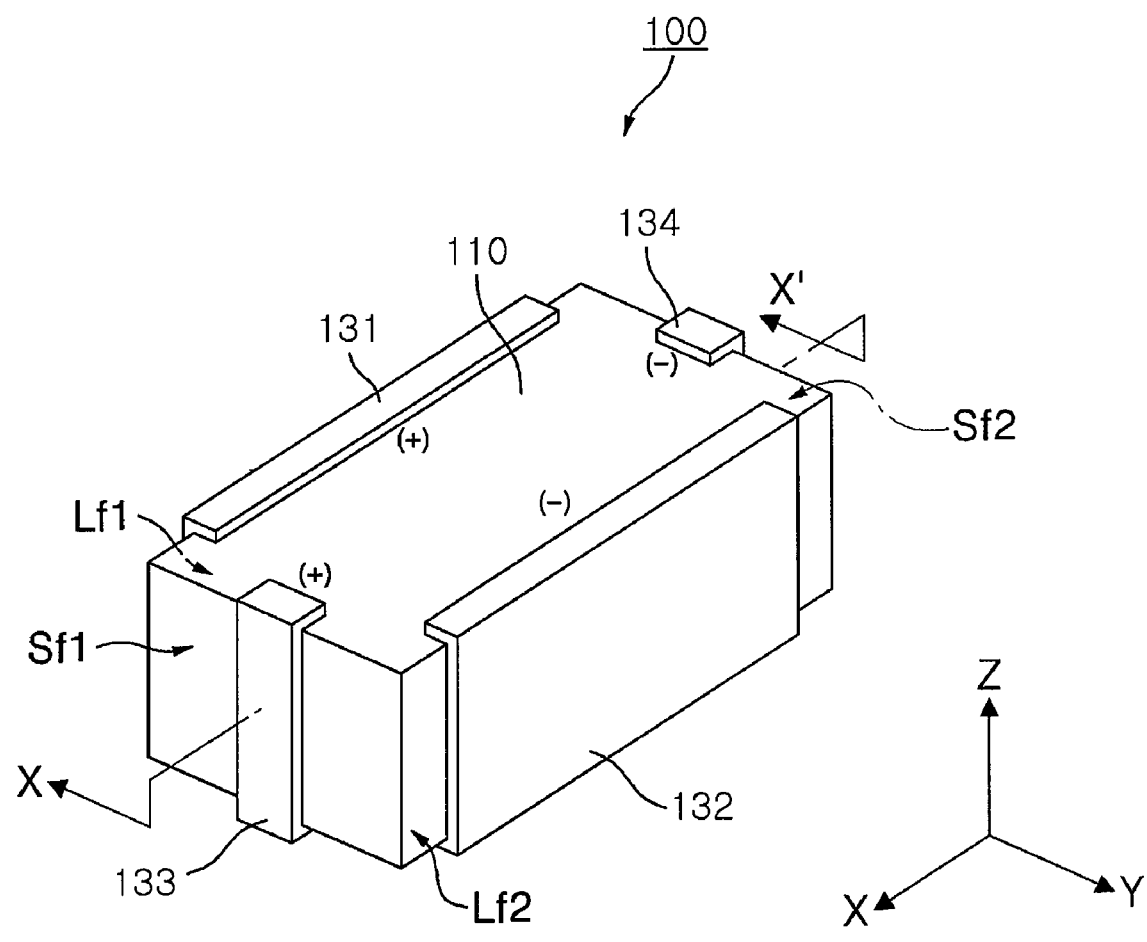
FIG. 3 is a perspective view of an external appearance of a multilayer chip capacitor according to an exemplary embodiment of the present invention.
Figure 4:
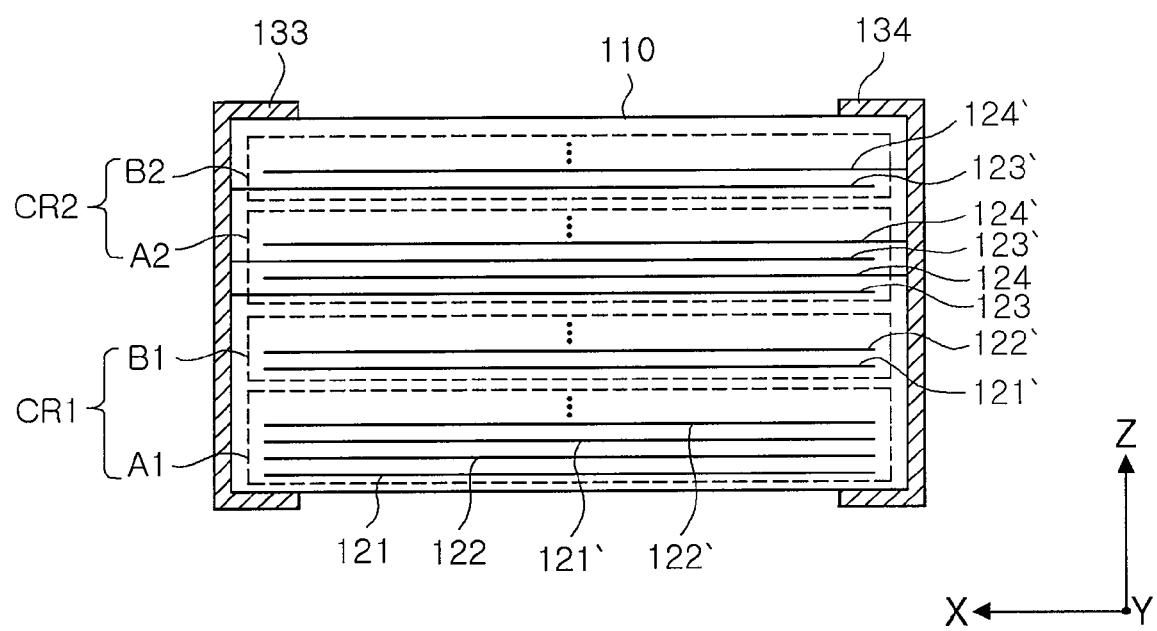
FIG. 4 is a cross-sectional view of the capacitor of FIG. 3, taken along the line X-X'.
Figure 5:
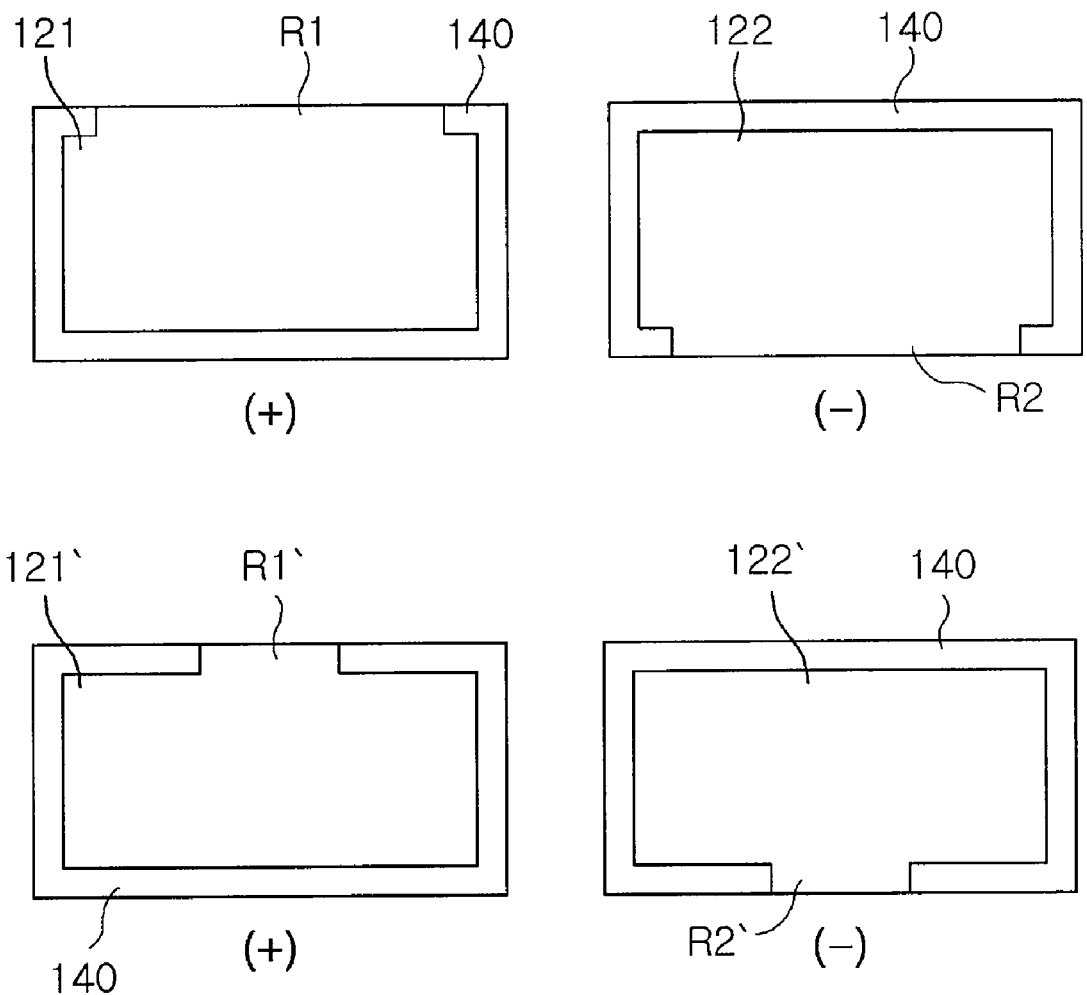
FIGS. 5 and 6 are plan views illustrating an internal electrode structure included in the capacitor of FIG. 3.
Figure 6:
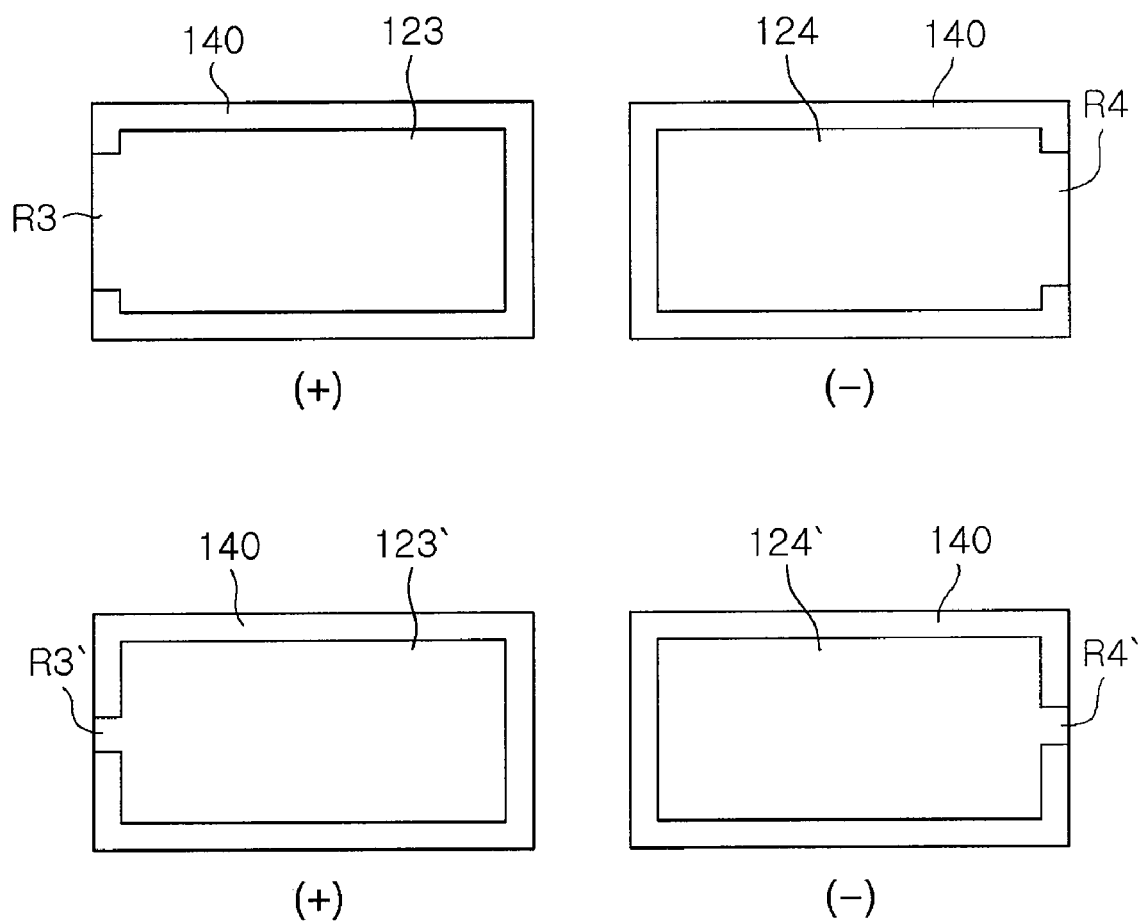

FIG. 3 is a perspective view of an external appearance of a multilayer chip capacitor according to an exemplary embodiment of the present invention. FIG. 4 is a cross-sectional view of the capacitor of FIG. 3, taken along the line X-X'. FIGS. 5 and 6 are plan views illustrating an internal electrode structure included in the capacitor of FIG. 3.

With reference to FIGS. 3 to 6, a capacitor 100 includes a capacitor body 110 having a rectangular parallelepiped-like shape and a plurality of external electrodes 131, 132, 133, and 134 (sequentially first to fourth external electrodes) formed on side surfaces of the capacitor body 110. The capacitor body 110 is formed by laminating a plurality of dielectric layers (140 in FIGS. 5 and 6), in which first to fourth internal electrodes 121, 122, 123, and 124 are separately disposed with the dielectric layer 140 interposed therebetween. The first and second external electrodes 131 and 132 are disposed on two facing longer side faces Lf1 and Lf2 of the capacitor body 110, and the third and fourth external electrodes 133 and 134 are disposed on two shorter side faces Sf1 and Sf2. In this case, the first and second internal electrodes 121 and 122 are connected only to the first and second external electrodes 131 and 132, and the third and fourth internal electrodes 123 and 124 are connected only to the third and fourth external electrodes 133 and 134.

Here, as shown in FIG. 3, the first and third external electrodes 131 and 133 have a positive (+) polarity and are connected to the first and third internal electrodes 121, 121', 123, and 123', while the second and fourth external electrodes 132 and 134 have a negative (−) polarity and are connected to the second and fourth internal electrodes 122, 122', 124, and 124'. As shown in FIGS. 4 and 5, the capacitor body 110 includes first and second capacitor units CR1 and CR2 disposed at different regions along a laminated direction (i.e., z-axis direction). The first and second internal electrodes 121 and 122 constitute the first capacitor unit CR1 and the third and fourth internal electrodes 123 and 124 constitute the second capacitor unit CR2. The first and second capacitor units CR1 and CR2 are electrically separated. Namely, the first and second capacitor units CR1 and CR2 are not electrically connected until before they are mounted on a circuit board.

The first capacitor unit CR1 may be divided into two regions A1 and B1. In consideration of their functions, the two regions A1 and B1 will be referred to as a first alternate disposition unit A1 and a first capacitance adjusting unit B1, respectively. The first capacitor unit CR1 includes the first internal electrodes 121 and 121' and the second internal electrodes 122 and 122'. As mentioned above, the first internal electrodes 121 and 121' and the second internal electrodes 122 and 122' are connected to the first and second external electrodes 131 and 132 formed on the longer side faces Lf1 and Lf2 of the capacitor body 110, respectively. In the first alternate disposition unit A1, the first internal electrodes 121 and 121' and the second internal electrodes 122 and 122' are alternately laminated. In this case, two different types of internal electrodes are provided, each having leads of different widths. Namely, as shown in FIG. 5, the first internal electrode 121 and the first internal electrode 121' have leads R1 and R1' provided to be connected with external electrodes and having different widths. In present embodiment, the lead R1 is wider than the lead R1. Likewise, a lead R2 of the internal electrode 122 is wider than a lead R2' of the internal electrode 122'.

In the first alternate disposition unit A1, the internal electrodes are staked from the bottom of the capacitor body 110 in the order of the internal electrodes 121-122-121'-122'-121-122-121'-122', which is noted that the two capacitors are alternately laminated by the two different types of internal electrodes of the leads. In this case, the capacitor constituted by the first and second internal electrodes 121 and 122 with the relatively large leads has a lower equivalent series inductance (ESL) provided per layer than that of the capacitor constituted by the first and second internal electrodes 121' and 122' with the relatively small leads. Thus, by disposing the capacitor constituted by the first and second internal electrodes 121 and 122 with the relatively large leads at the lower portion of the capacitor body 110, a current path with a relatively low impedance can be formed when the capacitor body 110 is mounted on a board to thereby perform a high frequency decoupling function. Here, the ESL per layer refers to an ESL provided by a pair of adjacent internal electrodes facing each other and having different polarities.

The first capacitance adjusting unit B1 is disposed on the first alternate laminating unit A1. Among the capacitors (two capacitors in present embodiment) included in the first alternate disposition unit A1, the proper number of internal electrodes of capacitors requiring a relatively large capacitance are laminated in the first capacitance adjusting unit B1 to obtain a desired capacitance. Namely, in present embodiment, the first and second internal electrodes 121' and 122' with the relatively smaller leads are laminated to form the first capacitance adjusting unit B1, and accordingly, the capacitance of the capacitor constituted by the first and second internal electrodes 121' and 122' can be increased relatively to perform the decoupling function at a lower frequency, compared with the capacitor constituted by the first and second internal electrodes 121 and 122 with the relatively wide leads.

In present embodiment, the first capacitor unit CR1 includes the two types of leads of the internal electrodes each having a different width, namely, the two types of capacitors, but without being limited thereto, the first capacitor unit CR1 may include more types of capacitors, and in this case, the capacitors may be configured such that their leads become smaller as it goes toward upper portion from the bottom of the capacitor body 110.

The second capacitor unit CR2 has the similar configuration to that of the first capacitor unit CR1 except that it includes the third internal electrodes 123 and 123' and the fourth internal electrodes 124 and 124' having leads led in the direction of the shorter side faces Sf1 and Sf2, respectively. Namely, the second capacitor unit CR2 includes a second alternate disposition unit A2 and a second capacitance adjusting unit B2, the third internal electrodes 123 and 123' are classified as two different types of internal electrodes having leads R3 and R3' each with a different width, and likewise, the fourth internal electrodes 124 and 124' are classified as two different types of internal electrodes having leads R4 and R4' each with a different width.

As noted from comparison in FIGS. 5 and 6, the third internal electrodes 123 and 123' and the fourth internal electrodes 124 and 124' have a longer current path than that of the first internal electrodes 121 and 121' and the second internal electrodes 122 and 122'. Namely, in the first capacitor unit CR1, the distance between the leads R1 and R2 of the vertically adjacent internal electrodes 121 and 122 having different polarities is relatively short, while, in the second capacitor unit CR2, the distance between the leads R3 and R4 of the vertically adjacent internal electrodes 123 and 124 having different polarities is relatively long. Accordingly, the ESL per layer of the capacitors included in the first capacitor unit CR1 is lower than that of the capacitors included in the second capacitor unit CR2. Thus, as in present embodiment, the first capacitor unit CR1, which include the internal electrodes having the shorter current path and the leads with the larger width to thus have the low ESL, is disposed near the bottom of the capacitor body 110, compared with the second capacitor unit CR2, current in the capacitor concentratively flows to the internal electrodes 121 and 122 with the relatively lower ESL at a high frequency, whereby the current path defined by the substantial current loop is shortened to maintain the overall ESL at an even lower level.

According to the multilayer chip capacitor 100, the first capacitor unit CR1 may be the part serving as the low ESL MLCC, namely, the LICC (Low Inductance Chip Capacitor) of the related art, and the second capacitor unit CR2 may be the part serving as the general two-terminal MLCC. Thus, the multilayer chip capacitor 100 corresponds to a capacitor integrating the conventional two-terminal MLCC and the low ESL LICC into a single chip. In particular, because the capacitor units CR1 and CR2 are classified as different capacitors having different characteristics (e.g., capacitance or resonance frequency), the decoupling function can be improved in a broad range.

In present embodiment, the first and second capacitor units CR1 and CR2 include the two types of capacitors, respectively, resulting in the multilayer chip capacitor 100 including four types of capacitors overall, but the present invention is not limited thereto and greater or fewer types of capacitors may be provided. Namely, two types of capacitors may be included in the first capacitor unit CR1 and one type of capacitor may be included in the second capacitor CR2 (or vice versa), totaling three capacitors overall. Alternatively, five or more capacitors may be included in the multilayer chip capacitor 100. Here, the different types of capacitors refer to capacitors having different capacitances and resonance frequencies, and in addition, if internal electrodes constituting capacitors are connected to different external electrodes, for example, a capacitor connected to first and second external electrodes and a capacitor connected to third and fourth external electrodes may be discriminated.

In this manner, the multilayer chip capacitor 100 as a single capacitor can lower the PDN impedance to below the target impedance at the hundreds of kHz to hundreds of MHz range. In particular, although the three or more types of capacitors are joined into the single chip as described above, there is no change in the substantial number of the capacitors. This facilitates designing of the PDN to satisfy the target impedance and helps satisfy the target impedance. In addition, because the decoupling two-terminal MLCC mounted on the motherboard and the decoupling low ESL MLCC mounted on the CPU package are integrated into the above-described multilayer chip capacitor 100, the number of decoupling capacitors used for the PDN of the CPU can be considerably reduced. Because the mid-frequency decoupling is performed by the second capacitor unit CR2 in the capacitor 100, the two-terminal MLCC for the mid-frequency decoupling is not required, or the number of required two-terminal MLCCs can be reduced.

Figure 7:
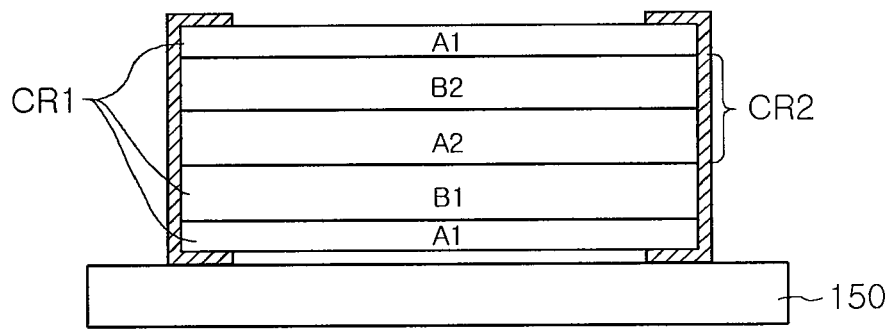
FIGS. 7 and 8 illustrate disposition methods of an alternate laminating unit and a capacitance adjusting unit of the multilayer chip capacitor according to one modification of the embodiments as illustrated in FIGS. 3 to 6.
Figure 8:
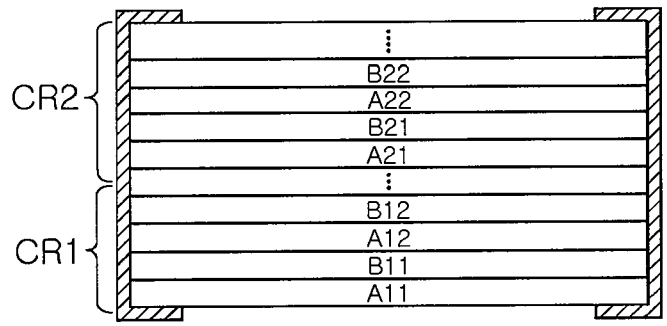

FIGS. 7 and 8 illustrate disposition methods of the alternate laminating unit and the capacitance adjusting unit of the multilayer chip capacitor according to one modification of the embodiments as illustrated in FIGS. 3 to 6. First, in the previous embodiment, a mark is needed to discriminate upper and lower portions of the chip in order to mount the first capacitor unit CR1 such that it is close to a board 150. Comparatively, with reference to FIG. 7, internal electrodes corresponding to a portion, e.g., a half, of the first alternate disposition unit A1 are disposed at the top of the capacitor body to obtain mounting symmetry. That is, no matter which one of lower and upper surfaces of the multilayer chip capacitor is mounted on the board 150, a current flow is concentrated to the first alternate disposition unit A1 belonging to the first capacitor unit CR1 at the high frequency, maintaining a low impedance.

The first and second capacitor units CR1 and CR2 may not include such single alternate disposition unit and single capacitance adjusting unit but two or more ones. Namely, as shown in FIG. 8, the first capacitor unit CR1 includes an alternate laminated unit A11 in which two types of capacitors are alternately disposed, and a capacitance adjusting unit B11 in which one of the two types of capacitors is disposed. An alternate laminated unit A12 and a capacitance adjusting unit B12 disposed thereon have the same laminating structure. Accordingly, the first capacitor unit CR1 may include capacitors that can be classified into four or more types of capacitors, and in this case, likewise as in the former embodiment, the alternate laminated unit A11 disposed at the bottom of the capacitor body may include internal electrodes having leads with the largest width. In the same manner, the second capacitor unit CR2 includes an alternate laminated unit A21 in which two types of capacitors are alternately disposed and a capacitance adjusting unit B21 in which one of the two types of capacitors is disposed, and an alternate laminated unit A22 and a capacitance adjusting unit B22 disposed thereon may have the same laminating structure.

Figure 9:
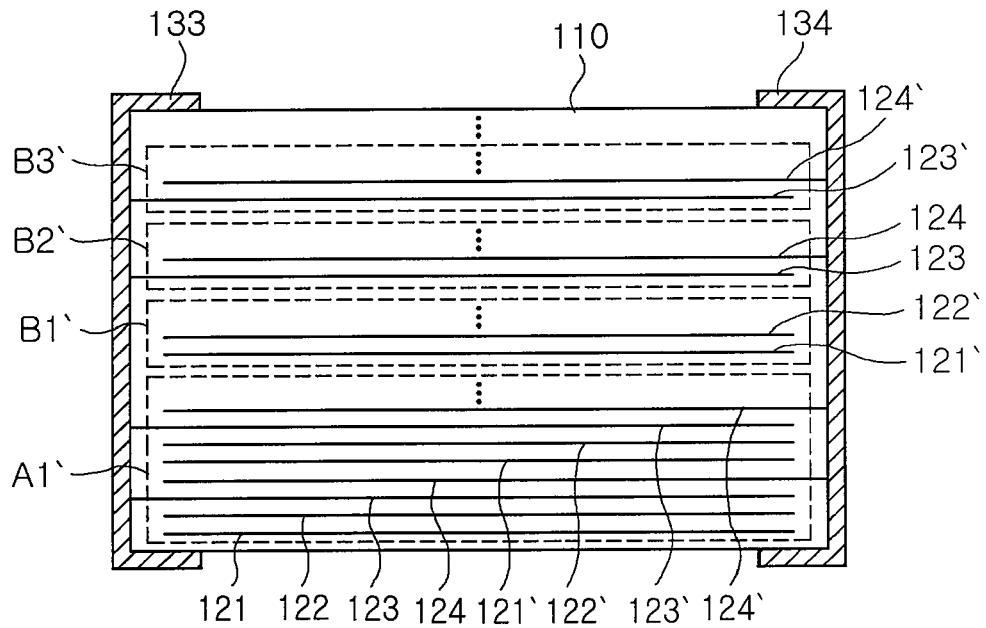
FIGS. 9 and 10 are cross-sectional views of a multilayer chip capacitor according to another modification of the embodiments as illustrated in FIGS. 3 to 7.
Figure 10:
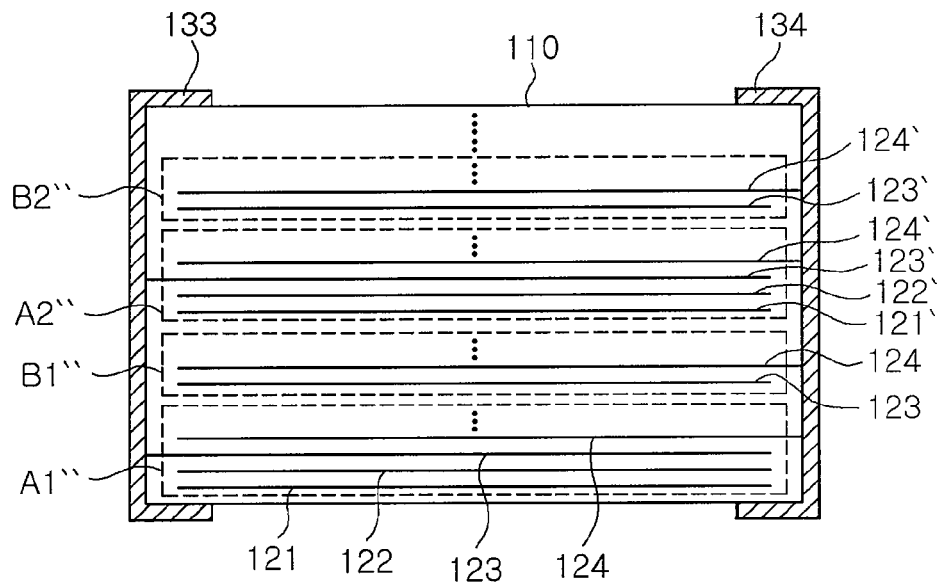
Figure 11:
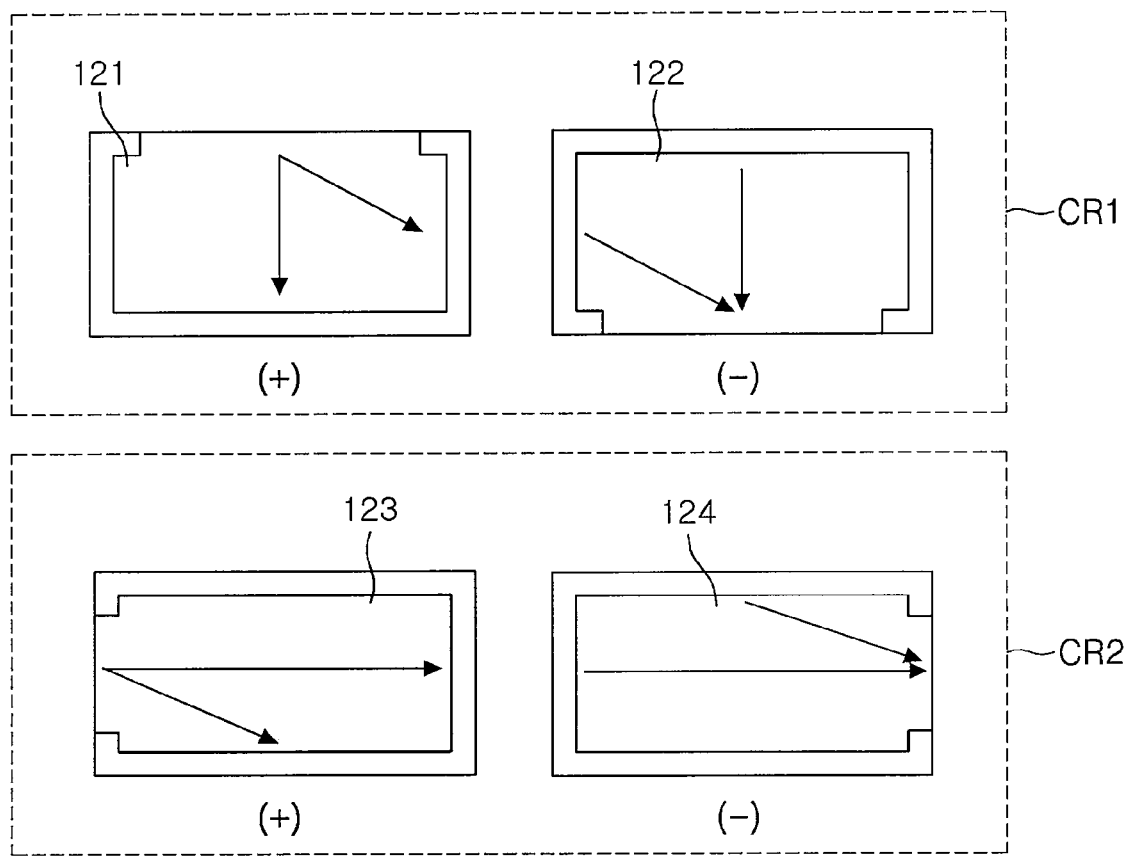
FIG. 11 is a plan view showing the shape of internal electrodes of the multilayer chip capacitor of FIGS. 9 and 10.

FIGS. 9 and 10 are cross-sectional views of a multilayer chip capacitor according to another modification of the embodiments as illustrated in FIGS. 3 to 7. FIG. 11 is a plan view showing the shape of internal electrodes of the multilayer chip capacitor of FIGS. 9 and 10. First, as for the embodiment shown in FIG. 9, one alternate laminated unit A1' and three or more capacitance adjusting units B1, B2, B3, . . . are provided in the capacitor body 110. In the alternate laminated unit A1', the first to fourth internal electrodes 121, 122, 123, and 124 are laminated from the bottom of the capacitor body 110 in this order, and on which first to fourth internal electrodes 121', 122', 123', and 124' having leads with a smaller width are laminated. This laminating structure is repeated. Of course, the internal electrodes may have three or more types of widths of leads as well as the two types of widths of leads. A suitable one of the capacitors included in the alternate laminated unit A1' may be selected to be laminated at the first to third capacitance adjusting units B1', B2', and B3' disposed on the alternate laminated unit A1'. In present embodiment, besides the first and second internal electrodes—having leads with a larger width—which require a relatively small capacitance, the first and second internal electrodes 121' and 122' having the leads with a relatively small width are repeatedly laminated to form the first capacitance adjusting unit B1'. Similarly, the third and fourth internal electrodes 123 and 124 are repeatedly laminated to form the second capacitance adjusting unit B2, and the third and fourth internal electrodes 123' and 124' having leads with a smaller width are repeatedly laminated to form the third capacitance adjusting unit B3'.

With reference to FIG. 10, in the similar manner as that that described with reference to FIG. 9, the first to fourth internal electrodes 121, 122, 123, and 124 are sequentially and repeatedly laminated in a first alternate laminated unit A'', on which the third and fourth internal electrodes are alternately and repeatedly laminated to form a first capacitance adjusting unit B1''. A second alternate laminated unit A2'', in which the first to fourth internal electrodes 121', 122', 123', and 124' having leads with a relatively small width are sequentially and repeatedly laminated, is disposed on the first capacitance adjusting unit B1'', and on which the third and fourth internal electrodes 123' and 124' having leads with an even smaller width are alternately and repeatedly laminated to form a second capacitance adjusting unit B2''. The number of alternate laminated units and the capacitance adjusting units may increase according to the types of capacitors, and preferably, the internal electrodes are disposed such that their leads have width that becomes narrow as it goes toward the upper portion of the capacitor body 110.

According to such laminating method as described with reference to FIGS. 9 and 10, the first and second capacitor units CR1 and CR2 are not separated to be positioned at different regions in the capacitor body 110, and the capacitors included in the first capacitor unit CR1 and those of the second capacitor unit CR2 are alternately disposed adjacently. Accordingly, current paths can be additionally generated in the respective internal electrodes 121 to 124, and 121' to 124' to lower the ESL. In other words, with reference to FIG. 11, when the capacitors belonging to the first capacitor unit CR1, namely, the capacitors (referred to as 'first capacitors', hereinafter) including the first and second internal electrodes 121 and 122, and the capacitors (referred to as 'second capacitors', hereinafter) belonging to the second capacitor unit CR2, namely, the capacitors including the third and fourth internal electrodes 123 and 124, are alternately laminated, the (−) internal electrode 124 included in the second capacitor is disposed adjacent to the (+) internal electrode 121 included in the first capacitor, and accordingly, other current paths (indicated as arrows in a diagonal direction) may be added to the existing current paths (indicated as arrows in a vertical direction), which can be also applicable to other internal electrodes. With such added current paths, the ESL per layer, e.g., the ESL formed by a pair of first and second internal electrodes 121 and 122, can be reduced.

Because the capacitors of the first capacitor unit CR1 and those of the second capacitor unit CR2 are alternately laminated, a possible increase in the ESL of the capacitors included in the second capacitor unit CR2 having a relatively large capacitance or resonance as the second capacitor unit CR2 is relatively far away from the mounting surface may be restrained. In addition, in the present embodiment, although the capacitor body 110 includes the capacitors having different capacitances, degradation of the overall capacitance of the capacitors can be prevented. If the internal electrodes of the first and second capacitor units CR1 and CR2 are connected to the same external electrode, the first and second capacitor units CR1 and CR2 need to be disposed such that they are spatially separated to make their capacitance different. In the present embodiment, however, because the first and second capacitor units CR1 and CR2 are electrically separated, removing the necessity of arranging them at certain intervals in the laminated direction, the number of internal electrodes possibly included in the capacitor body 110 can be increased, and accordingly, the overall capacitance of the entire capacitors can be also increased.

Figure 12:
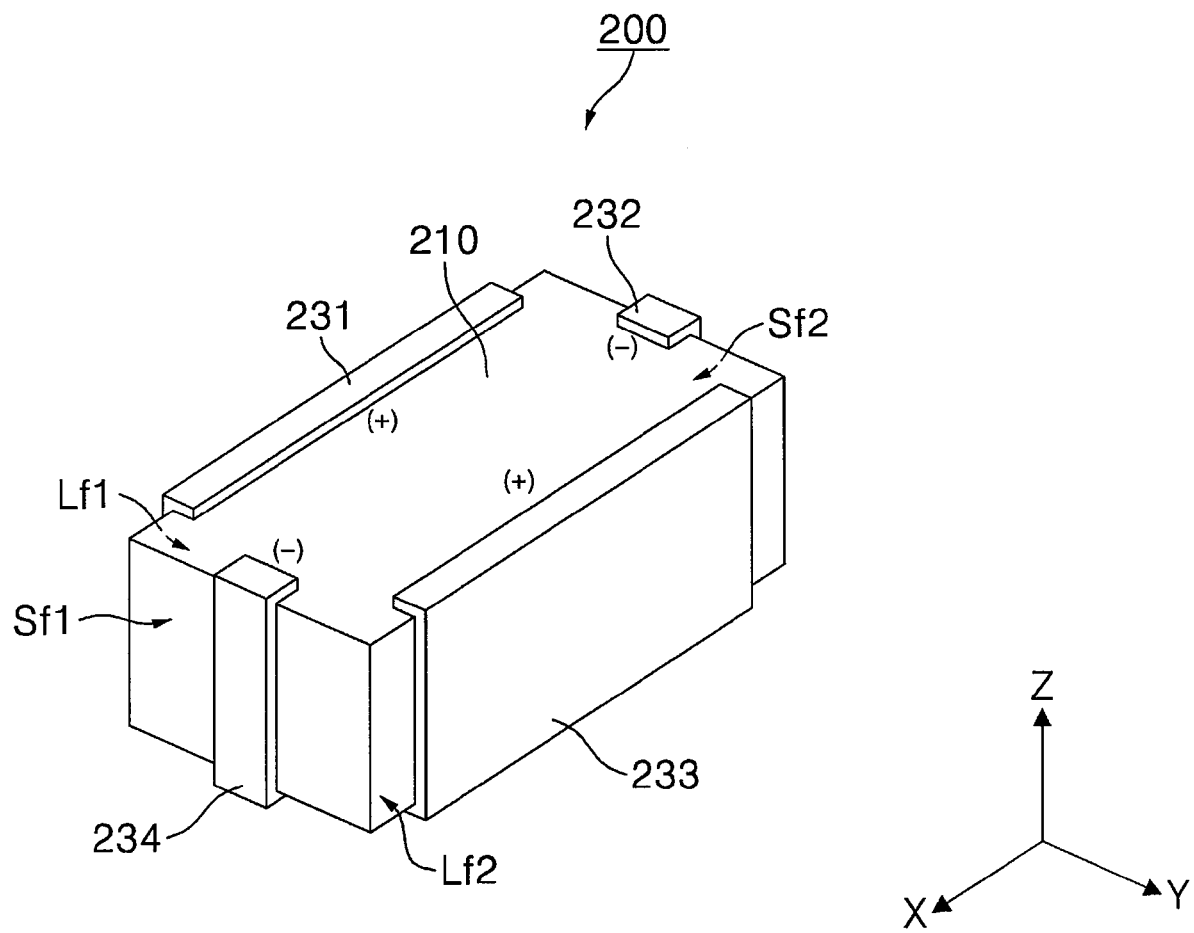
FIG. 12 is a perspective view of a multilayer chip capacitor according to another exemplary embodiment of the present invention.
Figure 13:
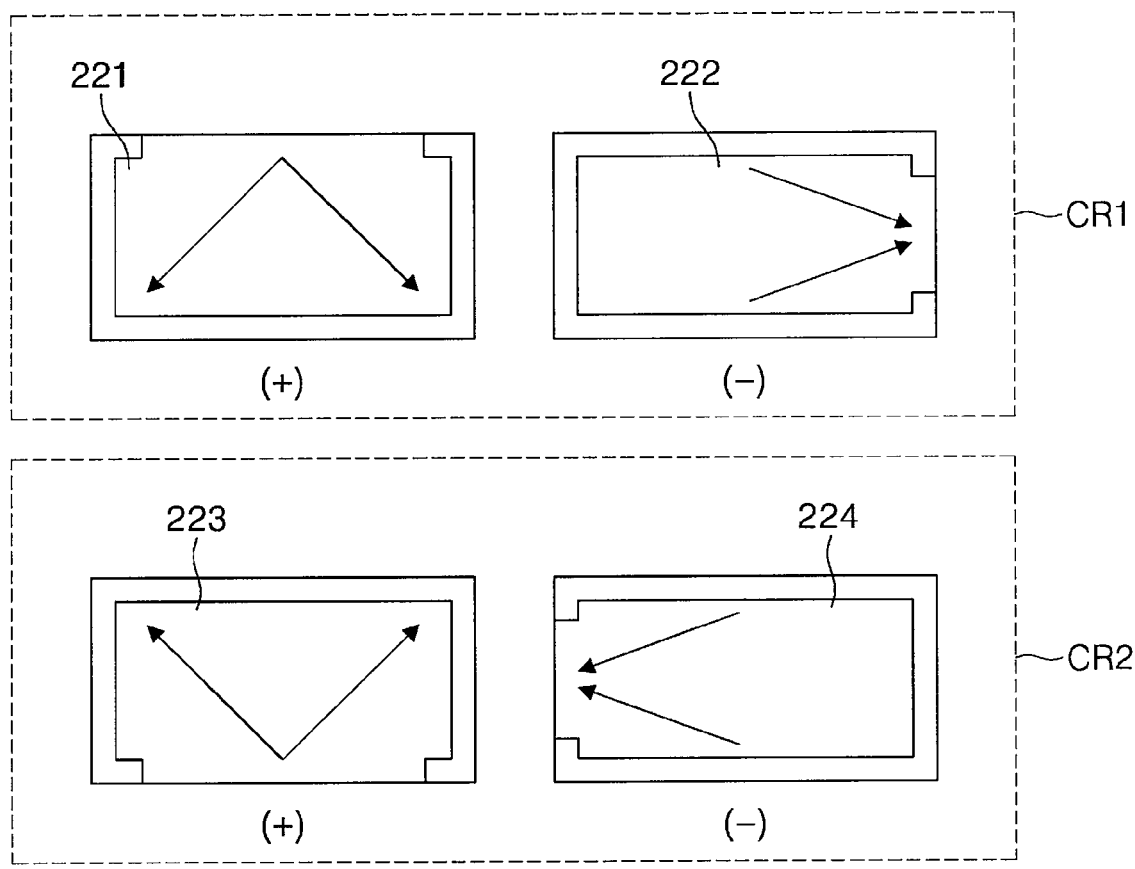
FIGS. 13 and 14 are plan views illustrating internal electrodes and current flows in the capacitor of FIG. 12.
Figure 14:
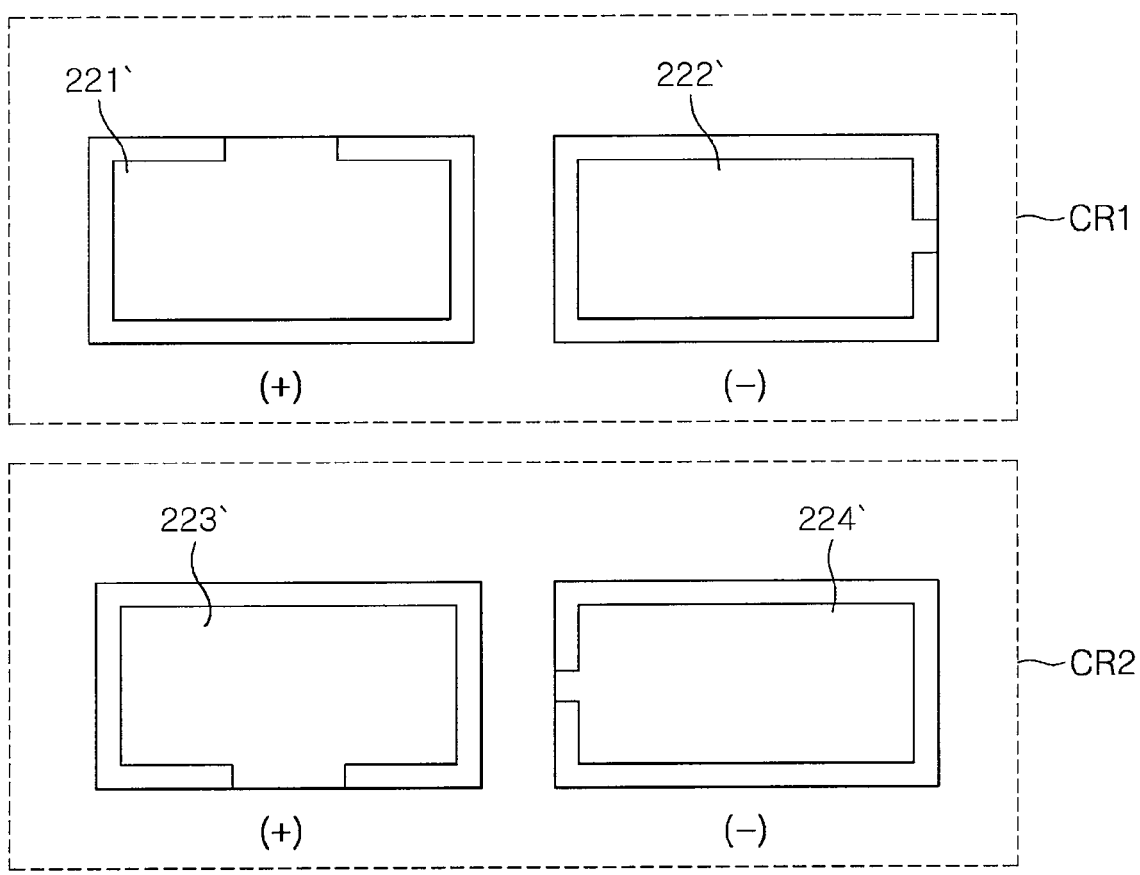

FIG. 12 is a perspective view of a multilayer chip capacitor according to another exemplary embodiment of the present invention, and FIGS. 13 and 14 are plan views illustrating internal electrodes and current flows in the capacitor of FIG. 12. First, with reference to FIG. 12, the multilayer chip capacitors 200 according to the present embodiment has the same external configuration compared with the capacitor 100 of FIG. 3 but is different in the arrangement of external electrodes. That is, as for first and second external electrodes 231 and 232 connected with the first and second internal electrodes constituting the first capacitor unit CR1, the first external electrode of a positive (+) polarity is formed on the first longer side face Lf1 of a capacitor body 210, and the second external electrode 232 of a negative (−) polarity is formed on the second shorter side face Sf2. As for third and fourth external electrodes 233 and 234 connected with the third and fourth internal electrodes constituting the second capacitor unit CR2, the third external electrode 233 of a positive (+) polarity is formed on the second longer side face Lf2, and the fourth external electrode 234 of a negative (−) polarity is formed on the first shorter side face Sf1. Accordingly, the shape of the internal electrodes is different from that of the former embodiment.

With reference to FIG. 13, first and second internal electrodes 221 and 222 constituting the first capacitor unit CR1 are connected to the first and second electrodes 231 and 232, and as the first and second external electrodes 231 and 232 are formed on the first longer side face Lf1 and the second shorter side face Sf2, the first and second internal electrodes 221 and 222 have the shape as shown in FIG. 13. Likewise, third and fourth internal electrodes 223 and 224 constituting the second capacitor unit CR2 have the shape as shown at a lower portion in FIG. 3. FIG. 14 illustrates first to fourth internal electrodes 221' to 224' having leads with a smaller width than that of the leads of the internal electrodes of FIG. 13, and as described above, the alternate disposition unit and the capacitance adjusting unit may be formed along with the first to fourth internal electrodes 221 to 224. Namely, besides the arrangement of the external electrodes and the shape of the internal electrodes, the matters described in the former embodiment may be all applied to the formation method of the alternate disposition unit and the capacitance adjusting unit in the present embodiment, which will be the same in any embodiments to be described hereinafter. Meanwhile, in the present embodiment, current flows in the internal electrodes 221 to 224 are shorter in their path than those as shown in FIG. 11, ensuring a further decrease in ESL.

Figure 15:
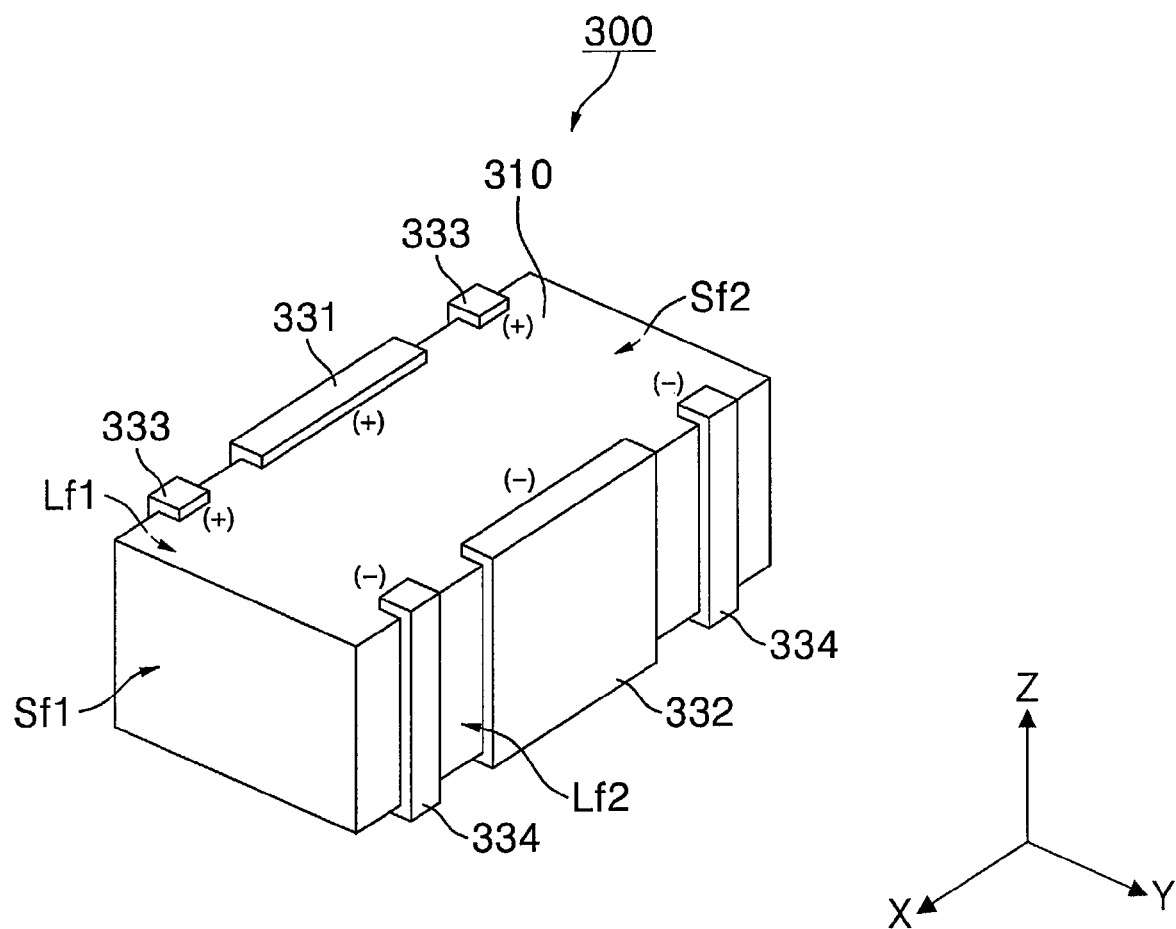
FIG. 15 is a perspective view of a multilayer chip capacitor according to still another exemplary embodiment of the present invention.
Figure 16:
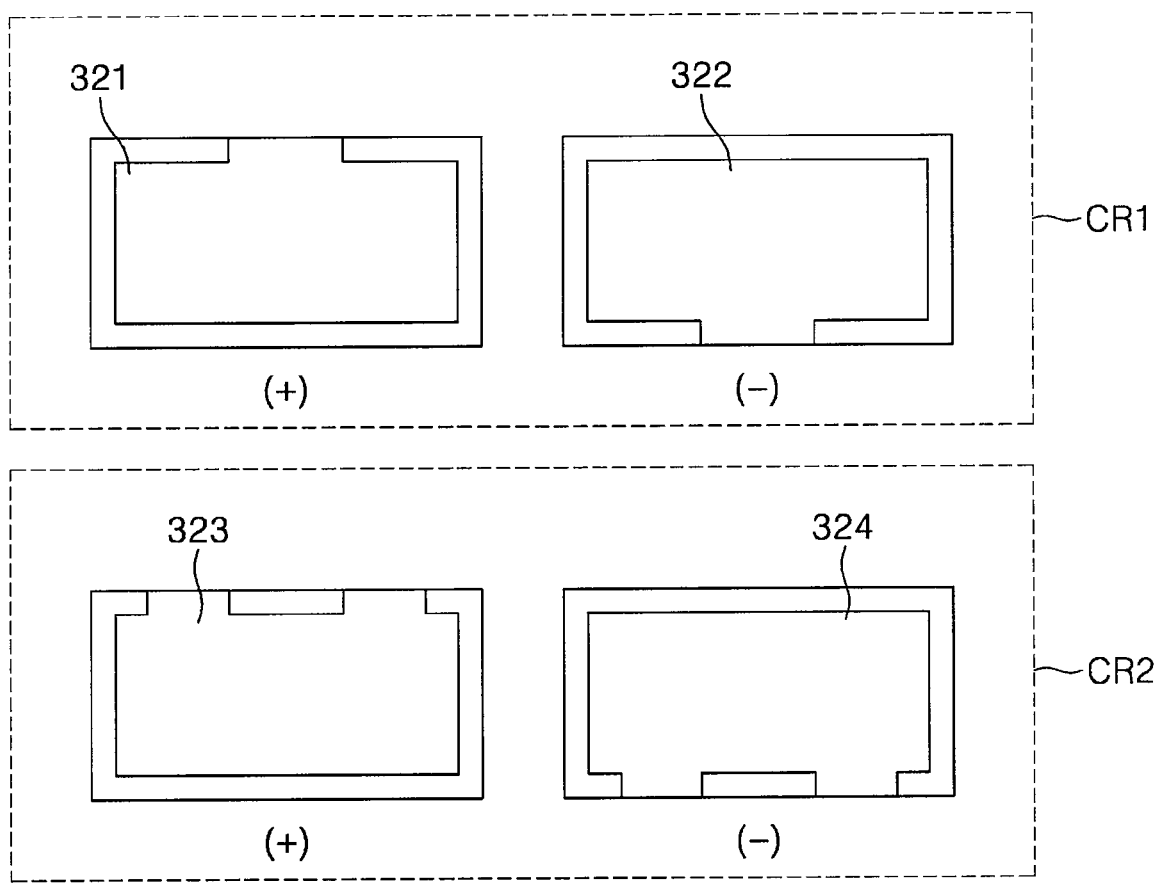
FIG. 16 is a plan view illustrating an internal electrode structure of the multilayer chip capacitor of FIG. 15.

FIG. 15 is a perspective view of a multilayer chip capacitor according to still another exemplary embodiment of the present invention, and FIG. 16 is a plan view illustrating an internal electrode structure of the multilayer chip capacitor of FIG. 15.

With reference to FIG. 15, in a multilayer chip capacitor 300 according to the present embodiment, a first external electrode 331 of a positive (+) polarity and two third external electrodes 333 of a positive (+) polarity are formed on the first longer side face Lf1 of the capacitor body 310, and a second external electrode 332 of a negative (−) polarity and two fourth external electrodes 334 of a negative (−) polarity are formed on the second longer side face Lf2. Namely, in this embodiment, the first to fourth external electrodes 331 to 334 are formed only on the longer side faces Lf1 and Lf2 of the capacitor body 310. The first external electrode 331 is disposed between the two third external electrodes 333, and the second external electrode 332 is disposed between the two fourth external electrodes 334. With reference to FIG. 16, first to fourth internal electrodes 321 to 324 have leads so as to be thereby connected to the first to fourth external electrodes 331 to 334, respectively.

The multilayer chip capacitor 300 is a six-terminal MLCC and has an increased mounting density with the external electrodes formed only on the first and second longer side faces Lf1 and Lf2. With such structure as in the present embodiment, the arrangements of the external electrodes and internal electrodes provide a horizontal symmetry of the chip. There is not much difference in ESL of the capacitors of the first and second capacitor units CR1 and CR2, so, unlike the previous embodiment, any of the first and second capacitors may be disposed first in the alternate disposition unit. Although not shown, the first to fourth internal electrodes 321 to 324 may have leads of different widths and the alternate disposition unit and the capacitance adjusting unit may be formed in the same manner as in the previous embodiment.

Figure 17:
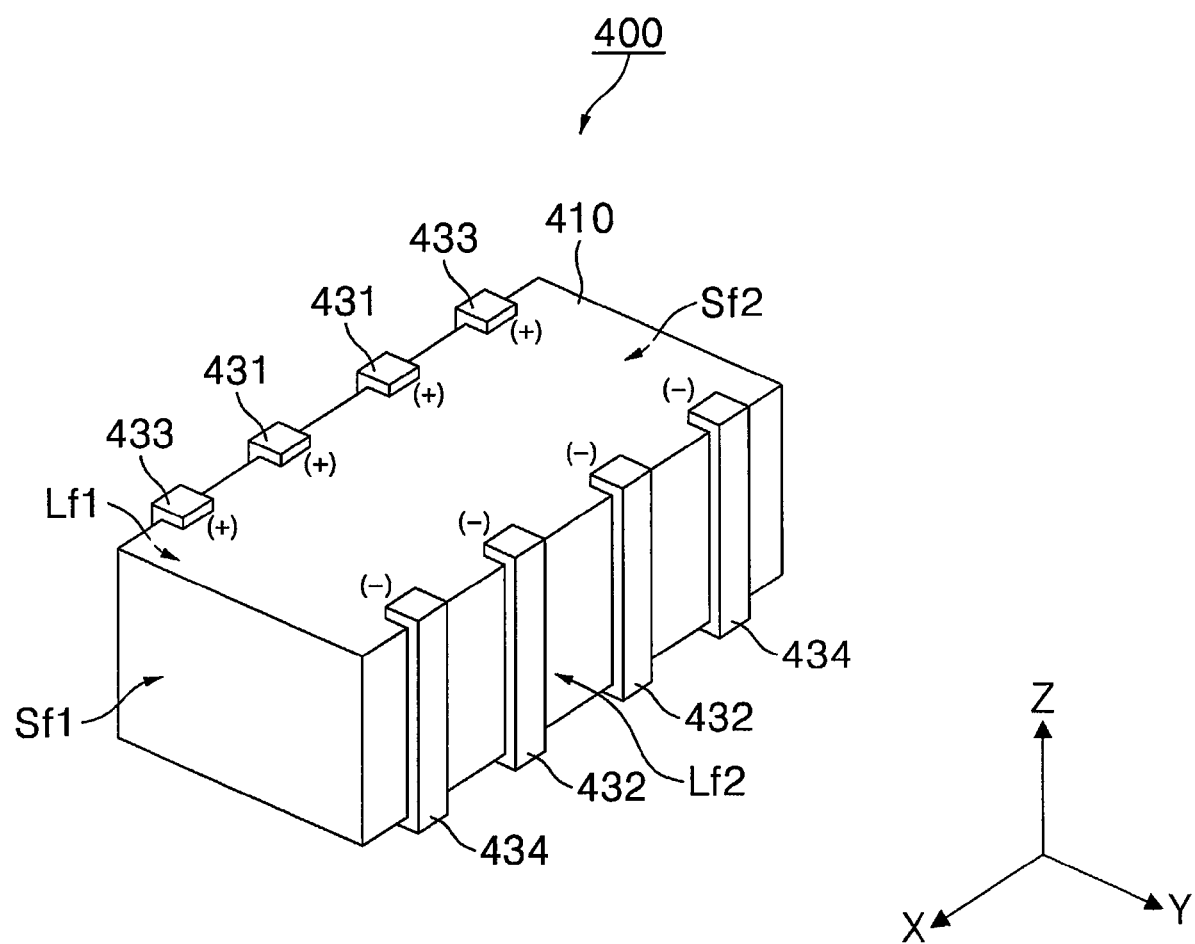
FIG. 17 is a perspective view of a multilayer chip capacitor according to yet another exemplary embodiment of the present invention.
Figure 18:
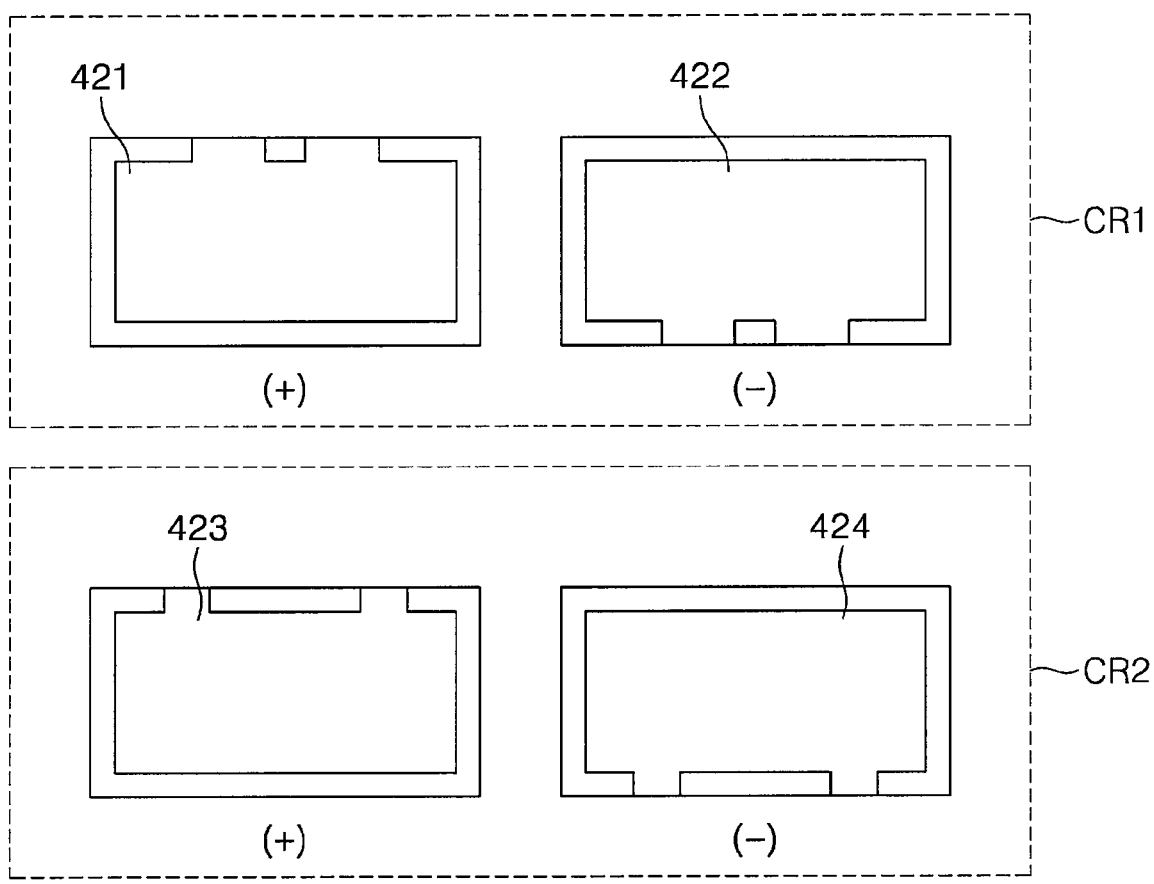
FIG. 18 is a plan view illustrating an internal electrode structure of the multilayer chip capacitor of FIG. 17.

FIG. 17 is a perspective view of a multilayer chip capacitor according to yet another exemplary embodiment of the present invention, and FIG. 18 is a plan view illustrating an internal electrode structure of the multilayer chip capacitor of FIG. 17.

With reference to FIG. 17, a multilayer chip capacitor 400 according to the present embodiment two first external electrodes 431 of a positive (+) polarity and two third external electrodes 433 of a positive (+) polarity are formed on the first longer side face Lf1 of a capacitor body 410, and two second external electrodes 432 of a negative (−) polarity and two fourth external electrodes 434 of a negative (−) polarity are formed on the second longer side face Lf2 of the capacitor body 410 (an eight-terminal MLCC). The first external electrodes 431 are disposed between the two third external electrodes 433, and the second external electrodes 432 are disposed between the two fourth external electrodes 434, securing the horizontal symmetry of the chip likewise as the case of FIG. 13.

As shown in FIG. 18, first to fourth internal electrodes 421 to 424 include leads so as to be thereby connected to the first to fourth external electrodes 431 to 434. With the internal electrodes of the first and second capacitor units CR1 and CR2 all connected to the external electrodes formed on the longer side faces Lf1 and Lf2 of the capacitor body 410, there is not much difference in ESL of the capacitors of the first and second capacitor units CR1 and CR2, so, unlike the previous embodiment, any of the first and second capacitors may be disposed first in the alternate disposition unit. The first to fourth internal electrodes 421 to 424 may have leads of different widths and the alternate disposition unit and the capacitance adjusting unit may be formed in the same manner as in the previous embodiment.

Figure 19:
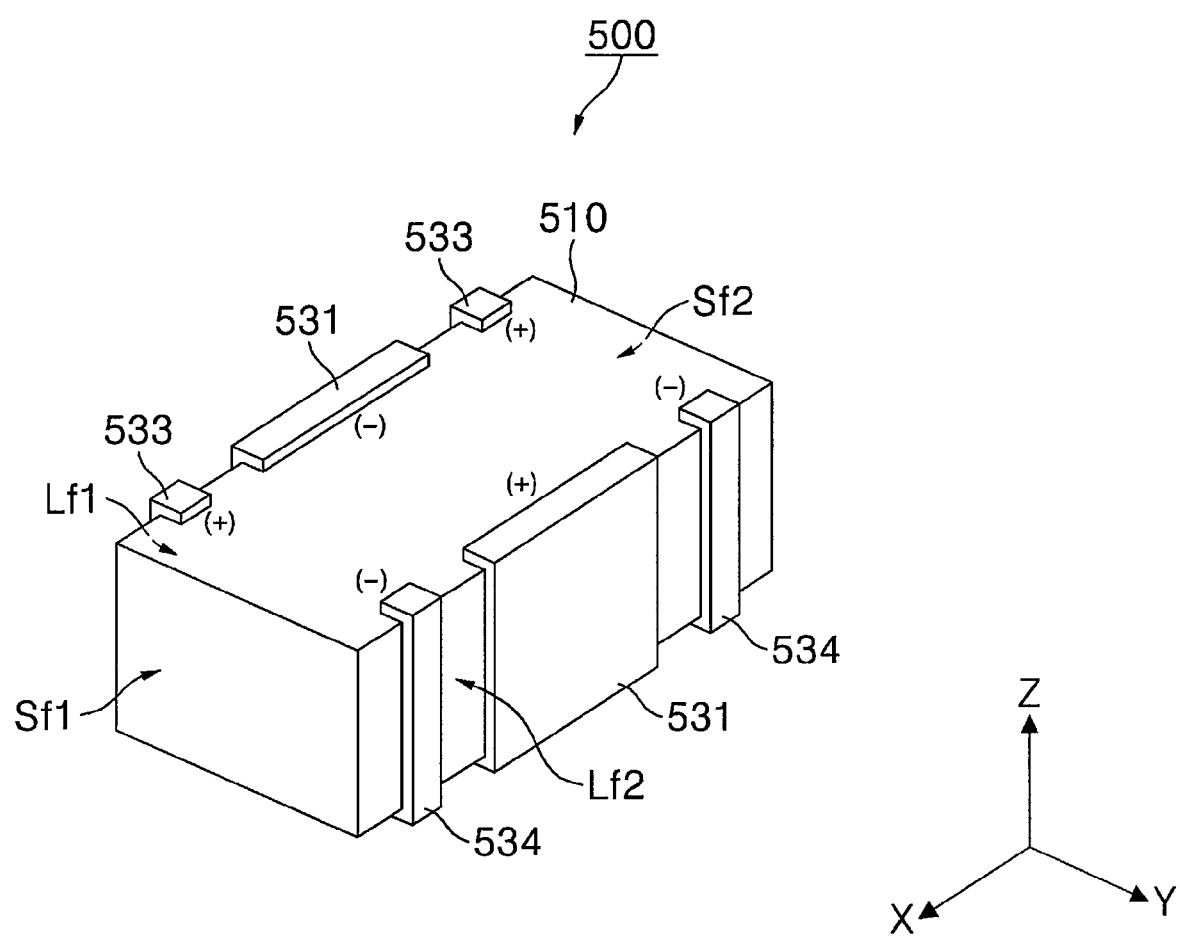
FIG. 19 is a perspective view of a multilayer chip capacitor according to a further exemplary embodiment of the present invention.
Figure 20:
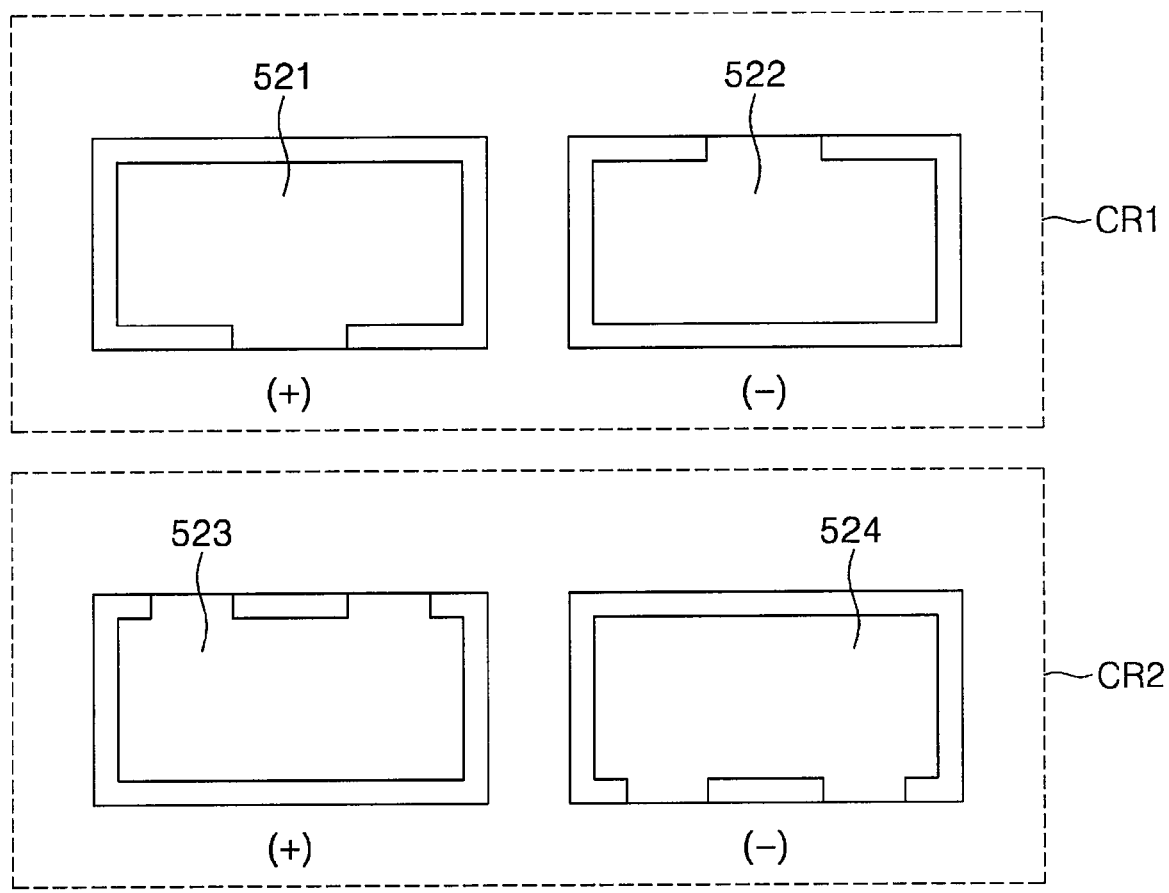
FIG. 20 is a plan view illustrating an internal electrode structure of the multilayer chip capacitor of FIG. 19.

FIG. 19 is a perspective view of a multilayer chip capacitor according to a further exemplary embodiment of the present invention, and FIG. 20 is a plan view illustrating an internal electrode structure of the multilayer chip capacitor of FIG. 19.

In the present embodiment, the external shape of a multilayer chip capacitor 500 of FIG. 19 is the same as that of FIG. 15 but different in the arrangement structure of external electrodes and the shape of internal electrodes of the capacitor. With reference to FIG. 19, in the multilayer chip capacitor 500, a second external electrode 532 of a negative (−) polarity and two third external electrodes 533 of a positive (+) polarity are formed on the first longer side face Lf1 of a capacitor body 510, and a first external electrode 531 of a positive (+) polarity and two fourth external electrodes 534 of a negative (−) polarity are formed on the second longer side face Lf2 of the capacitor body 510. The second external electrode 532 is disposed between two third external electrodes 533, and the first external electrode 531 is disposed between the two fourth external electrodes 534. Namely, the external electrodes having different polarities are alternately disposed on the longer side faces Lf1 and Lf2, and as shown in FIG. 20, first to fourth internal electrodes 521 to 524 include leads so as to be thereby connected to the first to fourth external electrodes 531 to 534. Accordingly, likewise in the previous embodiment, horizontal symmetry of the chip can be secured.

In particular, in the present embodiment, with reference to FIG. 20, currents flow through the adjacent internal electrodes 521 to 524 in the opposite directions to cancel out magnetic flux, reducing ELS. Meanwhile, the first to fourth internal electrodes 521 to 524 may have leads of different widths and the alternate disposition unit and the capacitance adjusting unit may be formed in the same manner as in the previous embodiment.

Figure 21:
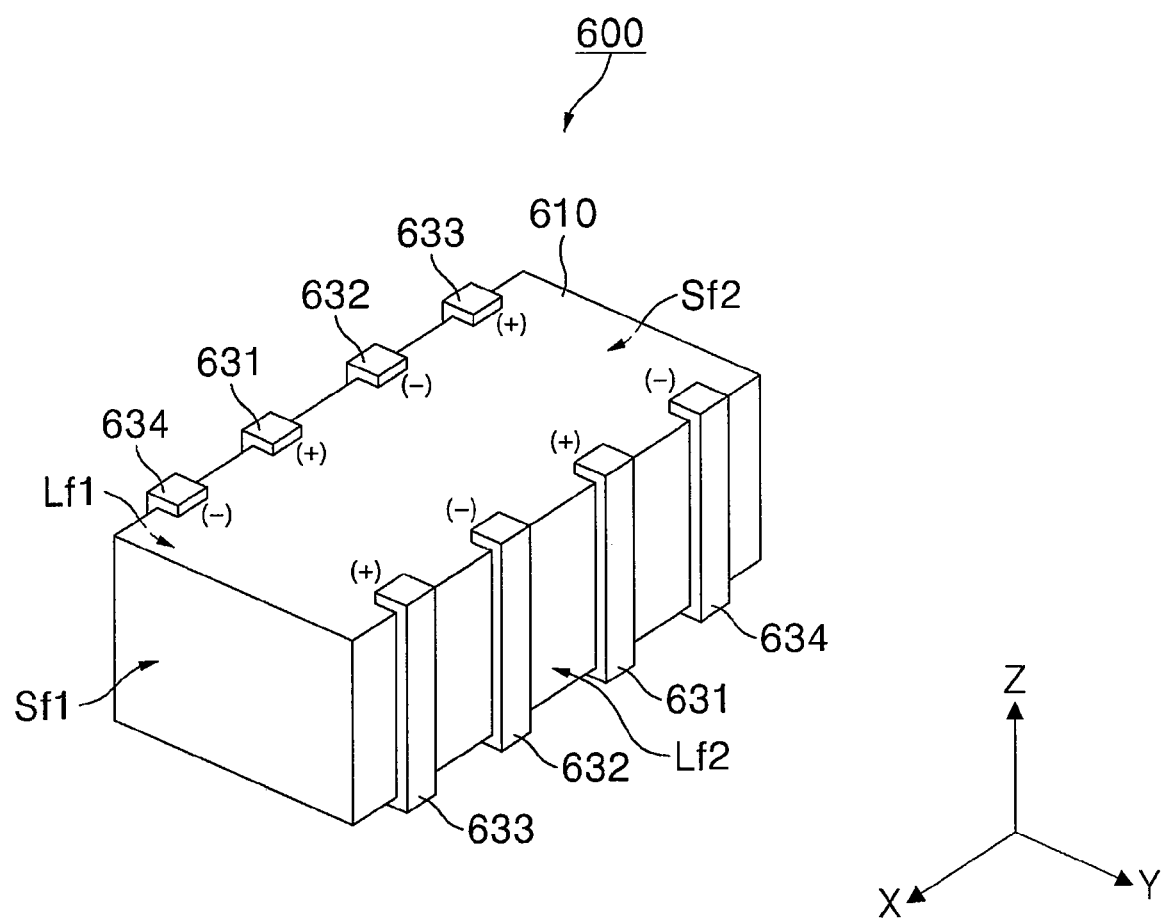
FIG. 21 is a perspective view of a multilayer chip capacitor according to a further exemplary embodiment of the present invention.
Figure 22:
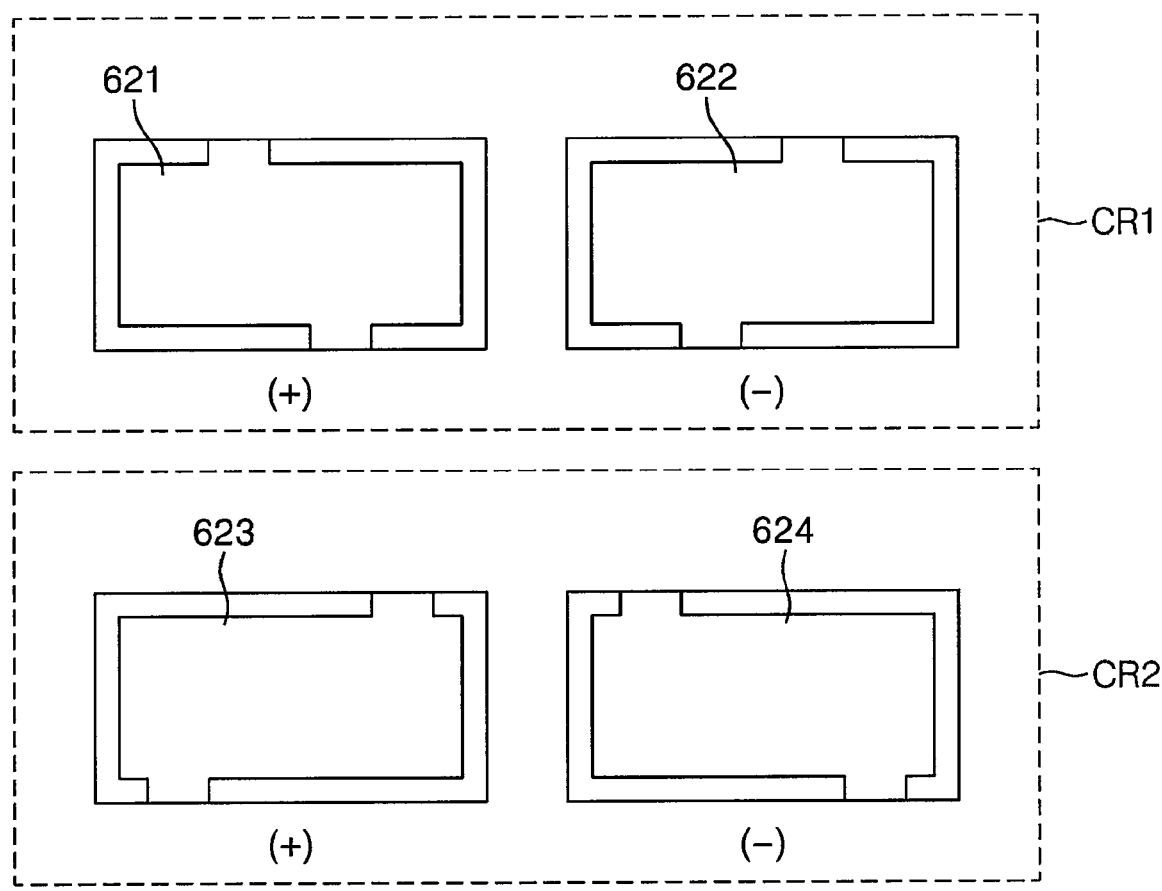
FIG. 22 is a plan view illustrating an internal electrode structure of the multilayer chip capacitor of FIG. 21.

FIG. 21 is a perspective view of a multilayer chip capacitor according to a further exemplary embodiment of the present invention, and FIG. 22 is a plan view illustrating an internal electrode structure of the multilayer chip capacitor of FIG. 21.

In the present embodiment, the external shape of a multilayer chip capacitor 600 of FIG. 21 is the same as that of FIG. 17 but different in the arrangement structure of external electrodes and shape of internal electrodes of the capacitor. With reference to FIG. 21, the multilayer chip capacitor 600 includes first to fourth external electrodes 631 to 634 by twos. The first to fourth electrodes 631 to 634 are formed one by one both on the first and second longer side faces Lf1 and Lf2 of a capacitor body 610. The first and second external electrodes 631 and 632 are disposed between the third and fourth external electrodes 633 and 634 such that their polarities are alternated, to secure horizontal symmetry of the chip.

With reference to FIG. 22, first to fourth internal electrodes 621 to 624 have leads so as to be thereby connected to the first to fourth external electrodes 631 to 634, and currents flow through the adjacent internal electrodes 621 to 624 in the opposite directions to cancel out magnetic flux, reducing ELS. In this case, there is not much difference in ESL of the first and second capacitor units CR1 and CR2, so any of the first and second capacitors may be disposed first in the alternate disposition unit. The first to fourth internal electrodes 621 to 624 may have leads of different widths and the alternate disposition unit and the capacitance adjusting unit may be formed in the same manner as in the previous embodiment.

Figure 23:
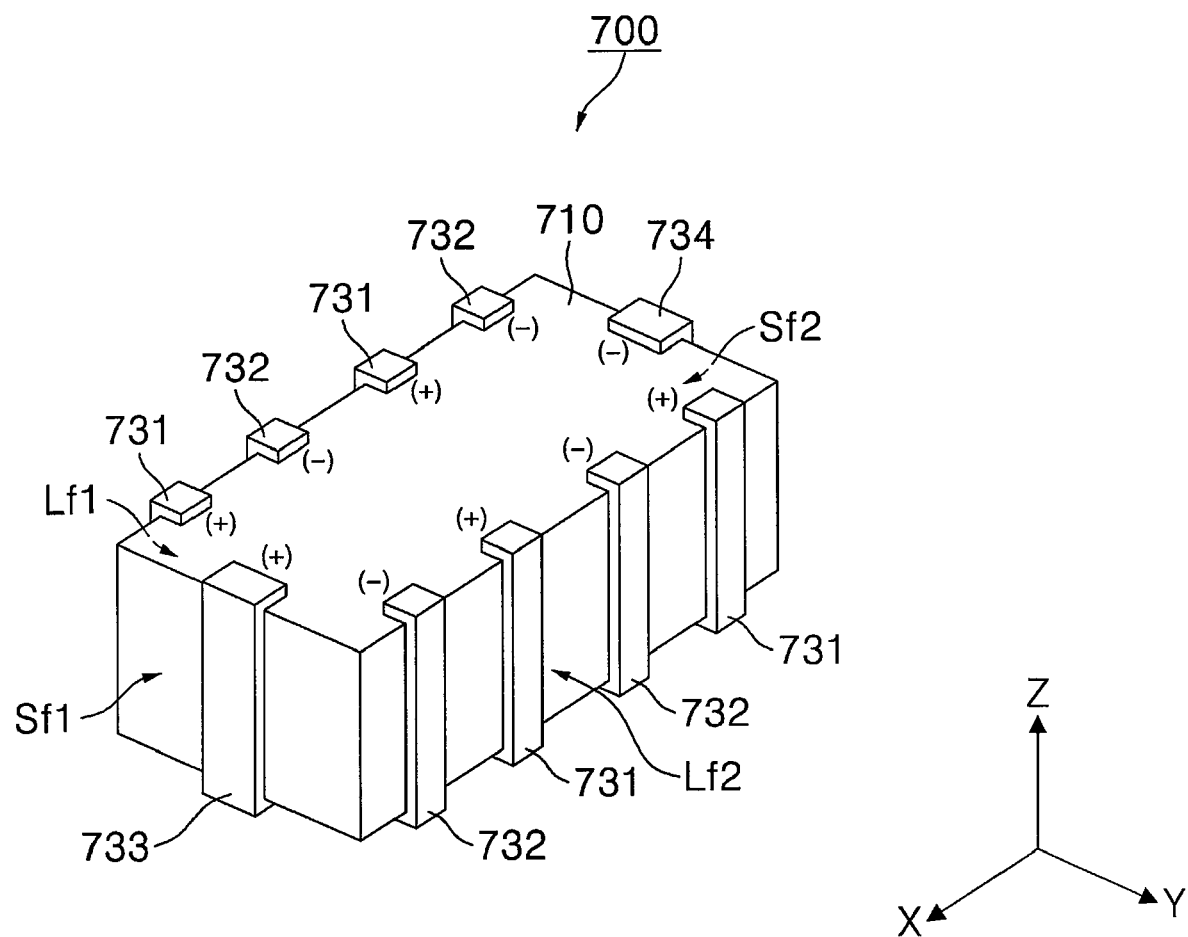
FIG. 23 is a perspective view of a multilayer chip capacitor according to a further exemplary embodiment of the present invention.
Figure 24:
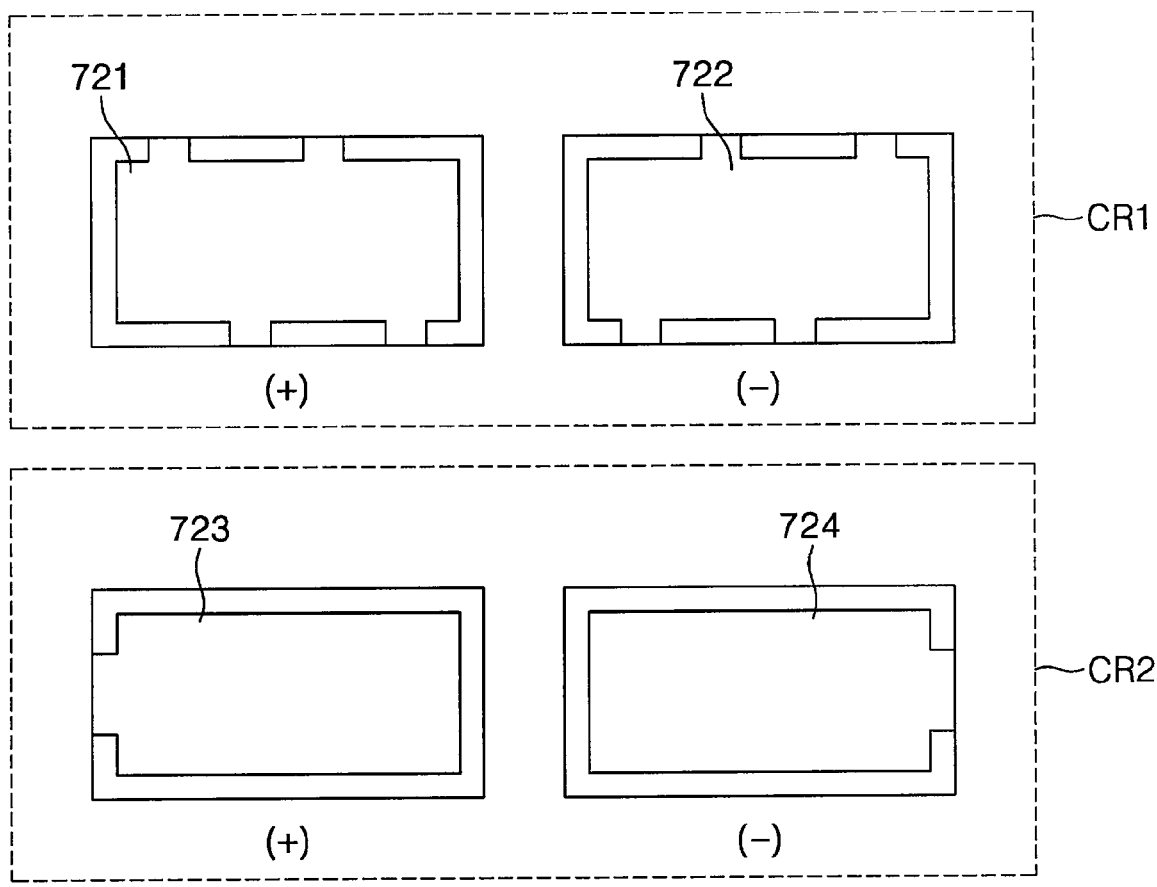
FIGS. 24 and 25 are plan views illustrating an internal electrode structure of the multilayer chip capacitor of FIG. 23.
Figure 25:
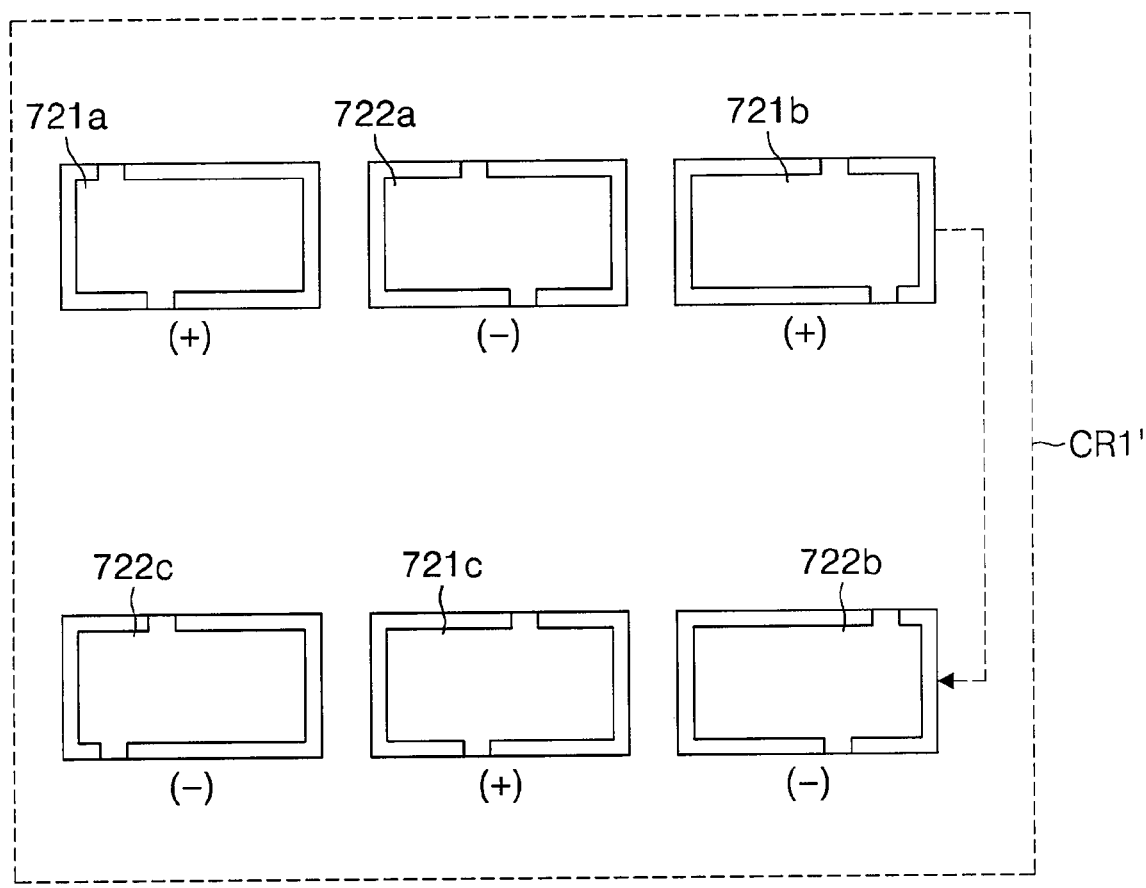

FIG. 23 is a perspective view of a multilayer chip capacitor according to a further exemplary embodiment of the present invention, and FIGS. 24 and 25 are plan views illustrating an internal electrode structure of the multilayer chip capacitor of FIG. 23.

With reference to FIG. 23, a multilayer chip capacitor 700 includes four first external electrodes 731 and four second external electrodes 732. The first and second external electrodes 731 and 732 are alternately formed by twos on the first and second longer side faces Lf1 and Lf2 of a capacitor body 710. In addition, third and fourth external electrodes 733 and 734 are formed on the first and second shorter side faces Sf1 and Sf2 of the capacitor body 710 (a ten-terminal MLCC). As shown in FIG. 24, first and second external electrodes 721 and 722 have four leads, respectively. The leads of the first internal electrodes 721 are arranged adjacent to those of the second internal electrode 722 in an interdigitated form and connected with the external electrodes 731 and 732 of corresponding polarities. With such interdigitated configuration, in the first capacitor unit CR1, magnetic fluxes are cancelled out in the adjacent internal electrodes to further reduce ESL.

The internal electrodes included in the first capacitor unit may have such a shape as shown in FIG. 25. With reference to FIG. 25, the capacitor belonging to a first capacitor unit CR1' includes three first internal electrodes 721a to 721c of a positive (+) polarity and three second internal electrodes 722a to 722 of a negative (−) polarity disposed alternately on the first and second longer side faces. In this case, the first and second internal electrodes 721a to 721c and 722a to 722c are connected to external electrodes of corresponding polarities by one lead, respectively. As shown in FIG. 25, the leads of the first and second internal electrodes 721a to 721c and 722a to 722c are disposed in a zigzag manner along the laminated direction. Such zigzag type lead arrangement leads to reduction in mutual inductance between the leads of the same polarity adjacent in the laminated direction.

Of the internal electrodes 721a to 721c and 722a to 722c, the leads led out to the first longer side face Lf1 are respectively disposed to be shifted by one space corresponding to the position of a next external electrode with respect to the leads led to the second longer side face Lf2. Such zigzag arrangement and shifted arrangement of the leads allow all the internal electrodes of the same polarity in the first capacitor unit CR1 to be electrically connected to each other. Also, in the present embodiment, the leads of the first and second internal electrodes in the first capacitor unit CR1, for example, 721a and 722a adjacent in the laminated direction are disposed adjacent to each other when viewed in the laminated direction.

Figure 26:
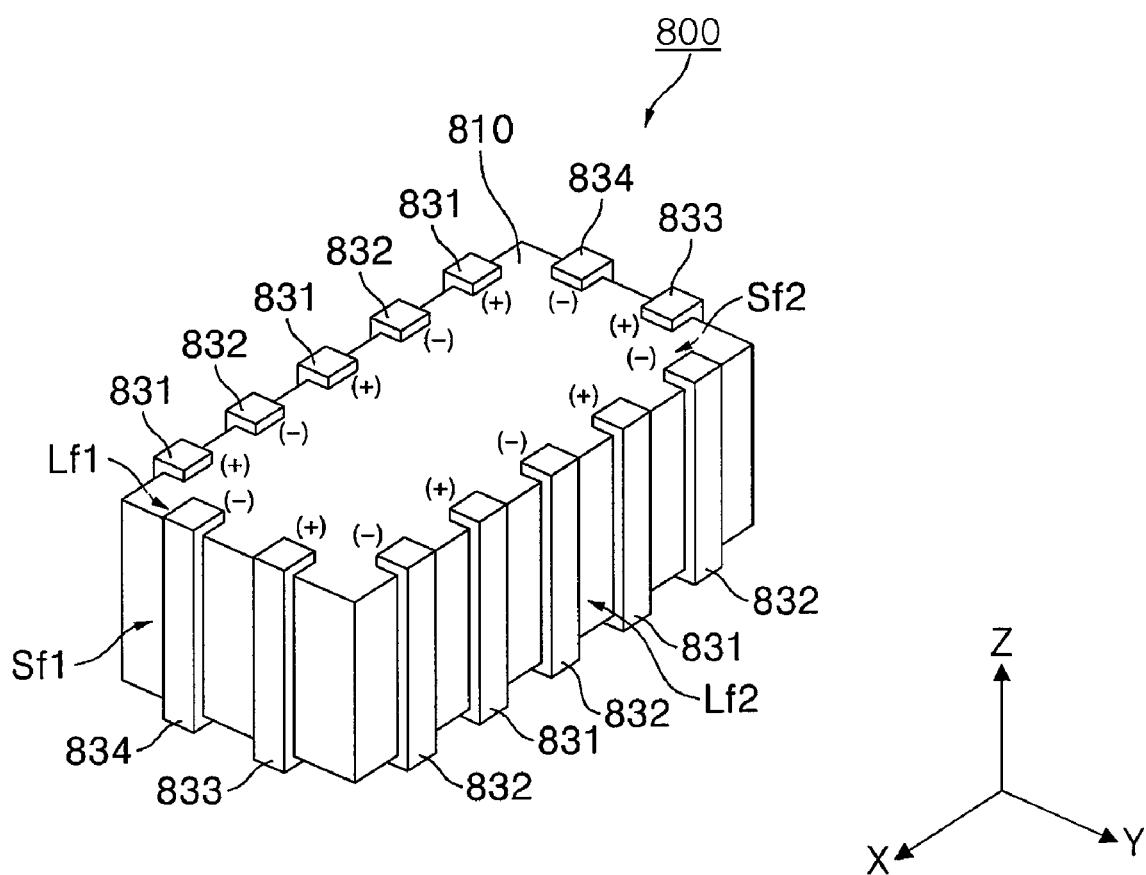
FIG. 26 is a perspective view of a multilayer chip capacitor according to a further exemplary embodiment of the present invention.
Figure 27:
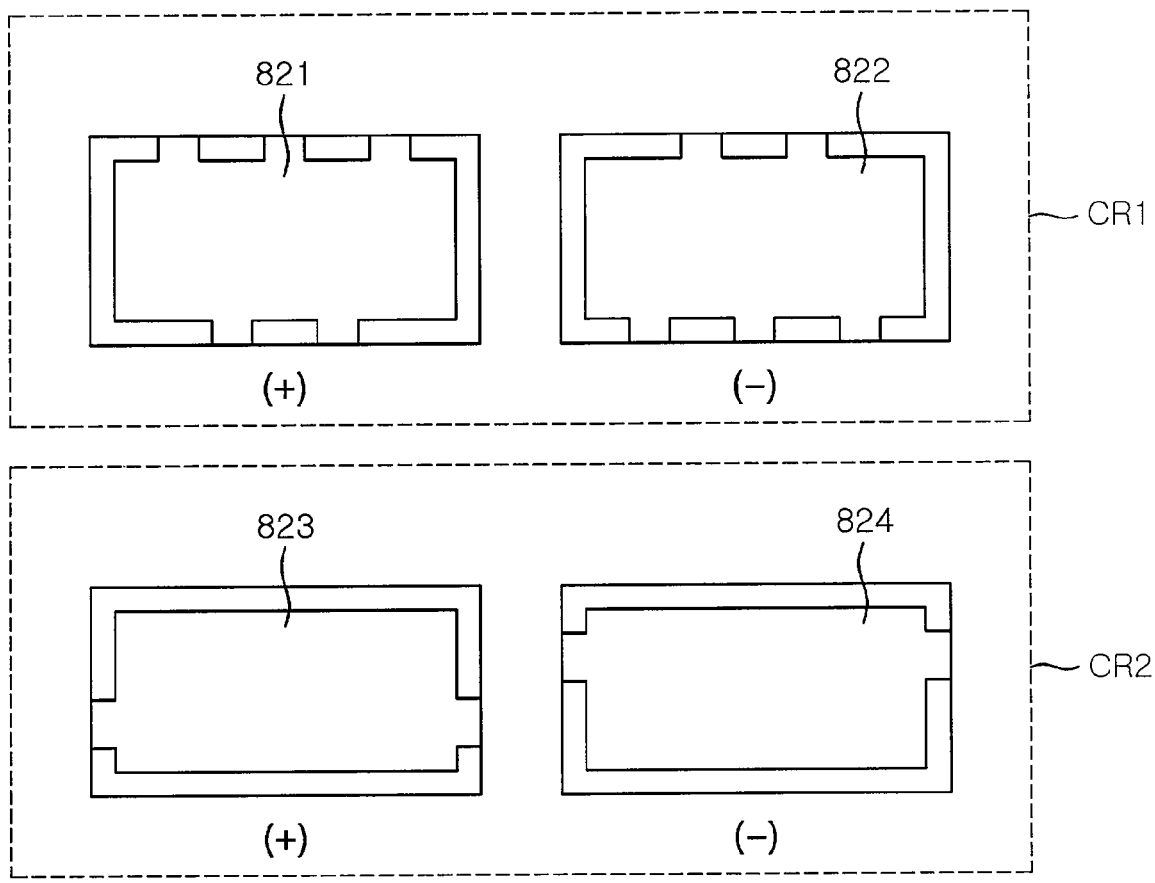
FIGS. 27 to 29 are plan views illustrating an internal electrode structure of the multilayer chip capacitor of FIG. 26.
Figure 28:
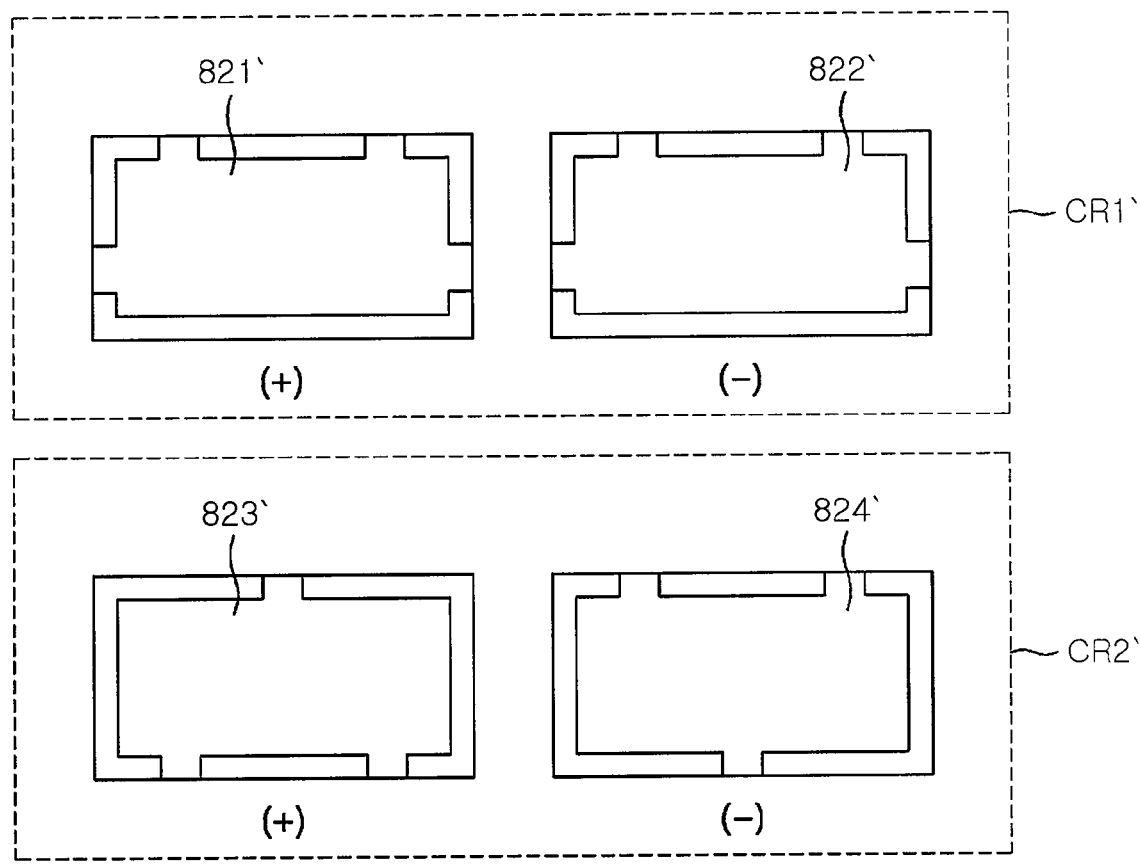
Figure 29:
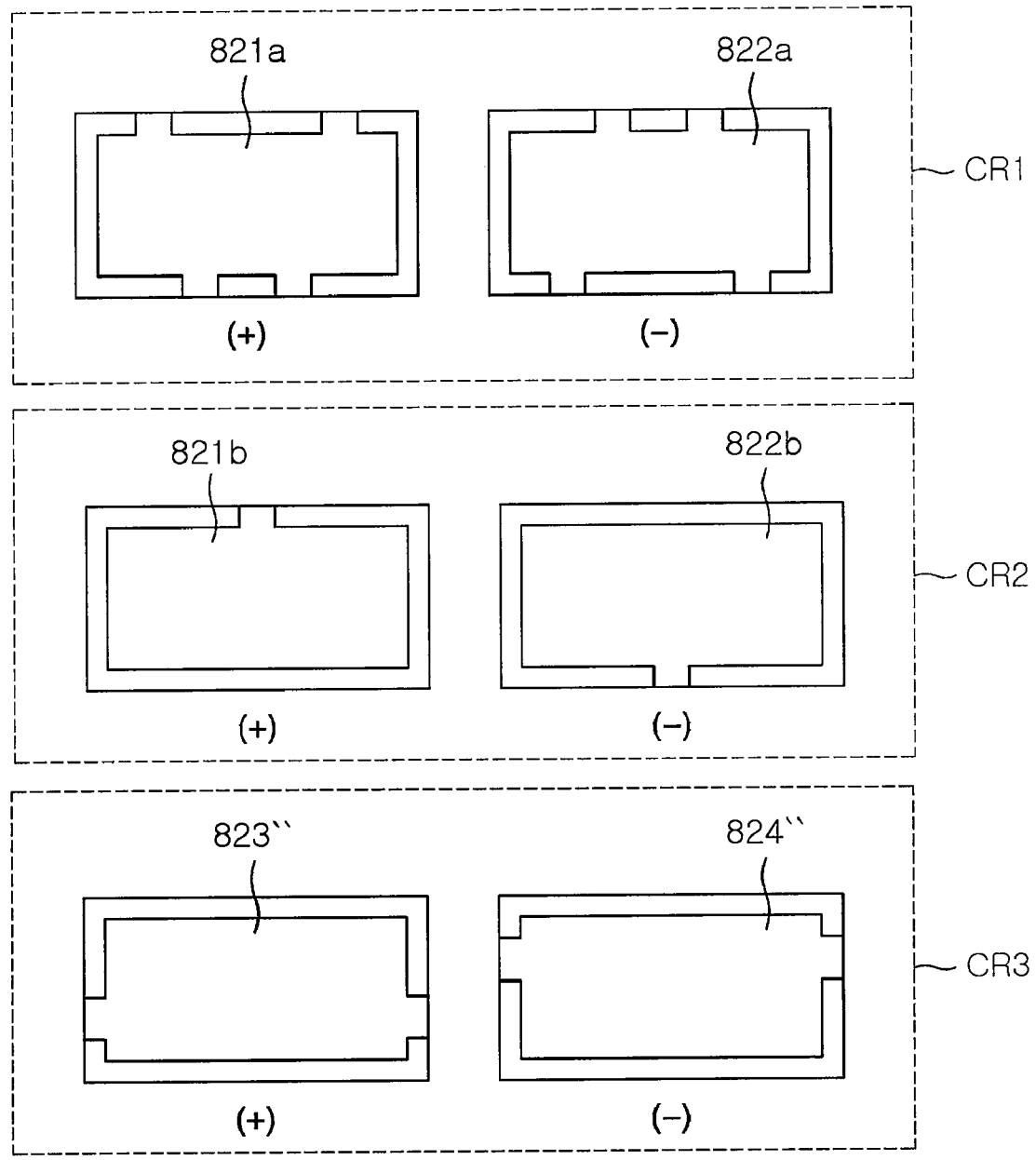

FIG. 26 is a perspective view of a multilayer chip capacitor according to a further exemplary embodiment of the present invention, and FIGS. 27 to 29 are plan views illustrating an internal electrode structure of the multilayer chip capacitor of FIG. 26.

With reference to FIG. 26, a multilayer chip capacitor 800 according to the present embodiment includes five first external electrodes 831 and five second external electrodes 832 alternately formed on the first and second longer side faces Lf1 and Lf2 of a capacitor body 810. In addition, third and fourth external electrodes 833 and 834 are formed one by one on both first and second shorter side faces Sf1 and Sf2 of the capacitor body 810 (a fourteen-terminal MLCC). With reference to FIG. 27, five leads of first internal electrodes 821 are arranged adjacent to five leads of the second internal electrode 822 in an interdigitated form and connected with the external electrodes 831 and 832 of corresponding polarities. With such interdigitated configuration, in the first capacitor unit CR1, magnetic fluxes are cancelled out in the adjacent internal electrodes to further reduce ESL.

As shown in FIG. 28, first and second internal electrodes 821' and 822' included in a first capacitor unit CR1' may be connected to both the longer and shorter side faces, and third and fourth internal electrodes 823' and 824' included in a second capacitor CR2' may be connected only to the longer side face. In addition, as shown in FIG. 29, the capacitor body 810 may include three (or more) capacitor units. Namely, in the present embodiment, the first internal electrodes 821a and 821b may be classified into internal electrodes each having different number of leads, and so do the second internal electrodes 822a and 822b. Third and fourth internal electrodes 823" and 824" have two leads, respectively. In this manner, the capacitor units may be discriminated depending on to which external electrodes the internal electrodes are connected and by the number of leads. In detail, the capacitor body 810 may include the first to third capacitor units CR1 to CR3. Likewise as in the previous embodiment, the capacitors included in the first to third capacitor units CR1 to CR3 may have internal electrodes having leads of different widths and include the alternate disposition unit and the capacitance adjusting unit.

Figure 30:
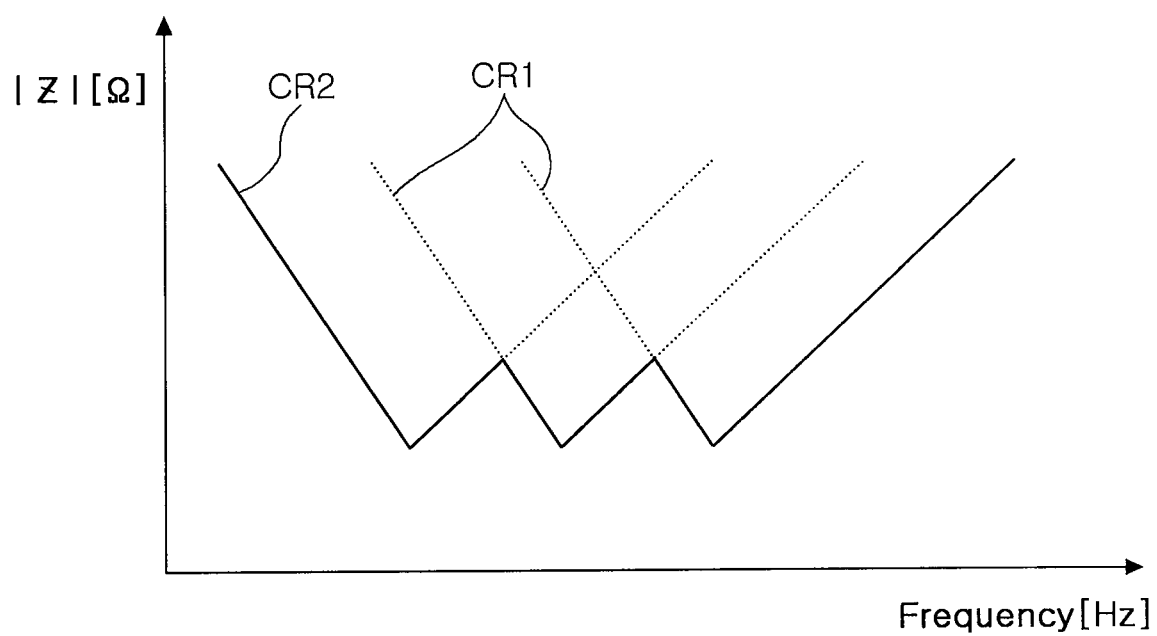
FIG. 30 is a graph of impedance characteristics of the multilayer chip capacitor fabricated according to an exemplary embodiment of the present invention.

FIG. 30 is a graph of impedance characteristics of the multilayer chip capacitor fabricated according to an exemplary embodiment of the present invention. The multilayer chip capacitor fabricated according to an embodiment of the present invention includes the first and second capacitor units CR1 and CR2 in the single chip, and overall, includes three or more capacitors each having a different number of times of laminating (capacitance) of the internal electrodes or the resonance frequency. In this case, the first capacitor unit CR1 includes two types of capacitors, and the second capacitor unit CR2 includes one type of capacitor. Accordingly, as shown in FIG. 30, impedance can be maintained at a lower level in a broad frequency range by using the multilayer chip capacitor of the single chip form. It is noted that the low frequency range is affected by the second capacitor unit CR2 with the relatively high ESL, and the high frequency range is affected by the first capacitor unit CR1 with the relatively low ESL.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer chip capacitor comprising:
 a capacitor body having a plurality of dielectric layers laminated therein and comprising first and second capacitor units; and
 first to fourth external electrodes formed on an outer surface of the capacitor body,
 wherein the first capacitor unit comprises first and second internal electrodes facing each other with the dielectric layer interposed therebetween, connected to the first and second external electrodes, and having different polarities, each pair of first and second internal electrodes being laminated one or more times to discriminate a plurality of capacitors with a certain capacitance,
 the second capacitor unit comprises third and fourth internal electrodes facing each other with the dielectric layer interposed therebetween, connected to the third and fourth external electrodes, and having the same polarities as those of the first and second internal electrodes, each pair of third and fourth internal electrodes being laminated one or more times to discriminate one or more capacitors each with a certain capacitance, and at least three capacitors included in the first and second capacitor units have different capacitances or resonance frequencies.

2. The capacitor of claim 1, wherein the first and second internal electrodes include leads so as to be thereby connected to the first and second external electrodes, and internal electrodes of at least two of the plurality of capacitors constituting the first capacitor unit have leads of different widths.

3. The capacitor of claim 2, wherein a capacitor having an internal electrode with the widest lead, among the plurality of capacitors constituting the first capacitor unit, is disposed at the lowermost portion of the first capacitor unit.

4. The capacitor of claim 3, wherein, among the plurality of capacitors constituting the first capacitor unit, the lead of internal electrodes included in a capacitor disposed at a lower portion is wider than that of an internal electrode included in a capacitor disposed at an upper portion.

5. The capacitor of claim 1, wherein the first and second internal electrodes comprises leads so as to be thereby connected to the first and second external electrodes, respectively, and internal electrodes included at least two of the plurality of capacitors constituting the first capacitor unit have different number of leads.

6. The capacitor of claim 1, wherein an alternate disposition unit is formed at one region of the first capacitor unit and has a structure in which the plurality of capacitors included in the first capacitor unit are alternately disposed, and a capacitance adjusting unit is formed at another region of the first capacitor unit and has a structure in which at least one of the plurality of capacitors included in the first capacitor unit is repeatedly disposed.

7. The capacitor of claim 6, wherein the second capacitor unit is discriminated into a plurality of capacitors each having a pair of third internal electrodes and a pair of fourth internal electrodes laminated one or more times to have a certain capacitance, a second alternate disposition unit is formed at one region of the second capacitor unit and has a structure in which the plurality of capacitors included in the first capacitor unit are alternately disposed, and a second capacitance adjusting unit is formed at another region of the second capacitor unit and has a structure in which at least one of the plurality of capacitors included in the second capacitor unit is repeatedly disposed.

8. The capacitor of claim 6, wherein the alternate disposition unit is disposed at a lower side of the capacitance adjusting unit in the first capacitor unit.

9. The capacitor of claim 6, wherein the alternate disposition units are disposed at the lowermost and uppermost portions within the capacitor body, and the second capacitor unit is positioned between the alternate disposition units.

10. The capacitor of claim 1, wherein a plurality of alternate disposition units are formed at one region of the first capacitor unit and has a structure in which two of the plurality of capacitors included in the first capacitor unit are alternately disposed, and a plurality of capacitance adjusting units are formed at another region of the first capacitor unit and has a structure in which one of two capacitors included in each of the plurality of alternate disposition units is repeatedly laminated.

11. The capacitor of claim 10, wherein the plurality of capacitance adjusting units are disposed at an upper portion of the plurality of alternate disposition units within the first capacitor unit.

12. The capacitor of claim 10, wherein the first and second internal electrodes have leads so as to be thereby connected to the first and second external electrodes, and among the plurality of capacitors constituting the first capacitor unit, the internal electrode of a capacitor disposed at a lower portion than that disposed at an upper portion in the first capacitor unit has a wider lead.

13. The capacitor of claim 1, wherein the second capacitor unit comprises a plurality of capacitors each having a pair of third internal electrodes and a pair of fourth internal electrodes laminated one or more times to have a certain capacitance, the third and fourth internal electrodes have leads so as to be thereby connected to the third and fourth external electrodes, and internal electrodes of at least two of the plurality of capacitors constituting the second capacitor unit have leads of different widths.

14. The capacitor of claim 13, wherein, among the plurality of capacitors constituting the second capacitor unit, a capacitor having an internal electrode with a widest lead is disposed at the lowermost portion of the second capacitor unit.

15. The capacitor of claim 14, wherein, among the plurality of capacitors constituting the second capacitor unit, the lead of the internal electrode included in a capacitor disposed at a lower portion have a larger width than that of the internal electrode included in a capacitor disposed at an upper portion.

16. The capacitor of claim 1, wherein the second capacitor unit is discriminated into a plurality of capacitors each having a pair of third internal electrodes and a pair of fourth internal electrodes laminated one or more times to have a certain capacitance, the third and fourth internal electrodes have leads so as to be thereby connected to the third and fourth external electrodes, and internal electrodes of at least two of the plurality of capacitors constituting the second capacitor unit have different numbers of leads.

17. The capacitor of claim 1, wherein an alternate disposition unit is formed at one region of the capacitor body and has a structure in which the capacitors included in the first capacitor unit and those included in the second capacitor unit are alternately laminated, and a capacitance adjusting unit is formed at another region of the capacitor body and has a structure in which at least one of the plurality of capacitors included in the first and second capacitor units is repeatedly disposed.

18. The capacitor of claim 17, wherein, among the capacitors included in the first and second capacitor units, the capacitor included in the first capacitor unit is disposed at the lowermost portion of the capacitor body.

19. The capacitor of claim 18, wherein the first to fourth internal electrodes have leads so as to be thereby connected to the first to fourth external electrodes, and the lead of the internal electrode included in the capacitor disposed at the lowermost portion of the capacitor body has the largest width.

20. The capacitor of claim 1, wherein a plurality of alternate disposition units are formed at one region of the capacitor body and have a structure in which one of the plurality of capacitors included in the first capacitor unit and one of the plurality of capacitors included in the second capacitor unit are alternately disposed, and a plurality of capacitance adjusting units are formed at another region of the capacitor body and have a structure in which one of two capacitors included in each of the plurality of alternate disposition units is repeatedly laminated.

21. The capacitor of claim 1, wherein a low equivalent series inductance (ESL) per layer provided by one pair of first and second internal electrodes within the capacitors included in the first capacitor unit is smaller than ESL per layer provided by one pair of third and fourth internal electrodes within the capacitors included in the second capacitor unit.

22. The capacitor of claim 21, wherein the first capacitor unit is disposed at a lower side of the second capacitor unit within the capacitor body.

23. The capacitor of claim 1, wherein the first and second capacitor units are electrically separated.

24. The capacitor of claim 1, wherein the multilayer chip capacitors is a four-terminal capacitor comprising the first to fourth external electrodes by ones.

25. The capacitor of claim 24, wherein the first to fourth internal electrodes are connected to the first to fourth external electrodes via a single lead, respectively.

26. The capacitor of claim 25, wherein the first and second external electrodes are formed on first and second longer side faces facing each other of the capacitor body, and the third and fourth external electrodes are formed on first and second shorter side faces facing each other of the capacitor body.

27. The capacitor of claim 25, wherein the first and second external electrodes are formed on the mutually adjacent first longer side face and first shorter side face, the third external electrode is formed on the second longer side face facing the first longer side face, and the fourth electrode is formed on the second shorter side face facing the first shorter side face of the capacitor body.

28. The capacitor of claim 1, wherein the third and fourth external electrodes are provided by twos, respectively, the first and second external electrodes are formed on the first and second longer side faces facing each other of the capacitor body, and the third and fourth external electrodes are formed on the first and second longer side faces.

29. The capacitor of claim 28, wherein the first external electrode is formed between the two third external electrodes, and the second external electrode is formed between the two fourth external electrodes.

30. The capacitor of claim 29, wherein the first and second external electrodes are provided by twos.

31. The capacitor of claim 1, wherein the third and fourth external electrodes are provided by twos, the first and second external electrodes are formed on the first and second longer side faces facing each other of the capacitor body, and the third and fourth external electrodes are formed on the second and first longer side faces of the capacitor body.

32. The capacitor of claim 31, wherein the first external electrodes are formed between the two fourth external electrodes, and the second external electrode are formed between the two third external electrodes.

33. The capacitor of claim 1 the first and second external electrodes are provided by twos, of which one is formed on the first longer side face, and the other is formed on the second longer side face facing the first longer side face, and the third and fourth external electrodes are provided by twos, of which one is formed on the first longer side face and the other is formed on the second longer side face facing the first longer side face of the capacitor body.

34. The capacitor of claim 33, wherein the first and second external electrodes are formed between the third and fourth external electrodes on the first and second longer side faces.

35. The capacitor of claim 34, wherein the polarities of the adjacent external electrodes on the first and second longer side faces are different.

36. The capacitor of claim 1, wherein the first and second external electrodes are provided by fours and are formed by twos on the first and second longer side faces facing each other, and the third and fourth external electrodes are formed on the first and second shorter side faces facing each other of the capacitor body.

37. The capacitor of claim 35, wherein the first and second external electrodes are alternately formed on the first and second longer side faces.

38. The capacitor of claim 37, wherein the first and second internal electrodes have four leads, respectively, so as to be thereby connected to the first and second external electrodes, and the leads of the first internal electrode and those of the second internal electrode are adjacently arranged in an interdigitated form so as to be connected with the external electrodes of corresponding polarities.

39. The capacitor of claim 37, wherein the first and second internal electrodes comprise a total of two leads led out to the first and second longer side faces so as to be connected to the first and second external electrodes, respectively, and in each of the first and second internal electrodes, the lead led out to the first longer side face is shifted by one space corresponding to the position of a next external electrode with respect to the lead led out to the second longer side face, and in the first capacitor, the leads led out to the first and second longer side faces are disposed in a zigzag manner along a laminated direction when viewed from each longer side face.

\* \* \* \* \*